(12) United States Patent
Salcedo

(10) Patent No.: US 8,610,251 B1
(45) Date of Patent: Dec. 17, 2013

(54) LOW VOLTAGE PROTECTION DEVICES FOR PRECISION TRANSCEIVERS AND METHODS OF FORMING THE SAME

(75) Inventor: Javier A Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/486,885

(22) Filed: Jun. 1, 2012

(51) Int. Cl.
*H01L 27/02* (2006.01)

(52) U.S. Cl.
USPC ............ 257/546; 257/173; 257/328; 257/355

(58) Field of Classification Search
USPC .......................... 257/173, 328, 355, 546, 565
See application file for complete search history.

(56) References Cited

U.S. PATENT DOCUMENTS

| | | | |
|---|---|---|---|
| 3,436,667 A | 4/1969 | Kedson | |
| 4,633,283 A | 12/1986 | Avery | |
| 5,061,652 A * | 10/1991 | Bendernagel et al. | ........ 438/104 |
| 5,276,582 A | 1/1994 | Merrill et al. | |
| 5,341,005 A | 8/1994 | Canclini | |
| 5,343,053 A | 8/1994 | Avery | |
| 5,652,689 A | 7/1997 | Yuan | |
| 5,663,860 A | 9/1997 | Swonger | |
| 5,742,084 A | 4/1998 | Yu | |
| 5,781,389 A | 7/1998 | Fukuzako et al. | |
| 5,889,644 A | 3/1999 | Schoenfeld et al. | |
| 6,137,140 A | 10/2000 | Efland et al. | |
| 6,144,542 A | 11/2000 | Ker et al. | |
| 6,236,087 B1 | 5/2001 | Daly et al. | |
| 6,258,634 B1 | 7/2001 | Wang et al. | |
| 6,310,379 B1 | 10/2001 | Andresen et al. | |
| 6,329,694 B1 | 12/2001 | Lee et al. | |
| 6,404,261 B1 | 6/2002 | Grover et al. | |

(Continued)

FOREIGN PATENT DOCUMENTS

| | | |
|---|---|---|
| DE | 10 2007 040 875 A1 | 3/2009 |
| EP | 0 168 678 A2 | 1/1986 |
| EP | 1 703 560 A2 | 9/2006 |
| KR | 10-2006-0067100 | 6/2006 |

OTHER PUBLICATIONS

Anderson et al., *ESD Protection under Wire Bonding Pads*, EOS/ESD Symposium 99-88, pp.2A.4.1-2A.4.7 (1999).

(Continued)

*Primary Examiner* — N Drew Richards
*Assistant Examiner* — Jay C Chang
(74) *Attorney, Agent, or Firm* — Knobbe, Martens, Olson & Bear LLP

(57) ABSTRACT

A bi-directional protection device includes a bi-directional NPN bipolar transistor including an emitter/collector formed from a first n-well region, a base formed from a p-well region, and a collector/emitter formed from a second n-well region. P-type active regions are formed in the first and second n-well regions to form a PNPNP structure, which is isolated from the substrate using dual-tub isolation consisting of an n-type tub and a p-type tub. The dual-tub isolation prevents induced latch-up during integrated circuit powered stress conditions by preventing the wells associated with the PNPNP structure from injecting carriers into the substrate. The size, spacing, and doping concentrations of active regions and wells associated with the PNPNP structure are selected to provide fine-tuned control of the trigger and holding voltage characteristics to enable the bi-directional protection device to be implemented in high voltage applications using low voltage precision interface signaling.

21 Claims, 12 Drawing Sheets

(56) References Cited

U.S. PATENT DOCUMENTS

| | | | |
|---|---|---|---|
| 6,512,662 B1 | 1/2003 | Wang | |
| 6,590,273 B2 | 7/2003 | Okawa et al. | |
| 6,665,160 B2 | 12/2003 | Lin et al. | |
| 6,667,870 B1 | 12/2003 | Segervall | |
| 6,704,180 B2 | 3/2004 | Tyler et al. | |
| 6,724,603 B2 | 4/2004 | Miller et al. | |
| 6,756,834 B1 | 6/2004 | Tong et al. | |
| 6,768,616 B2 | 7/2004 | Mergens et al. | |
| 6,960,792 B1 | 11/2005 | Nguyen | |
| 7,034,363 B2 | 4/2006 | Chen | |
| 7,038,280 B2 | 5/2006 | Righter | |
| 7,071,528 B2 | 7/2006 | Ker et al. | |
| 7,232,705 B2 | 6/2007 | Righter | |
| 7,232,711 B2 | 6/2007 | Gambino et al. | |
| 7,335,543 B2 | 2/2008 | Chen et al. | |
| 7,345,341 B2 | 3/2008 | Lin et al. | |
| 7,385,793 B1 | 6/2008 | Ansel et al. | |
| 7,436,640 B2 | 10/2008 | Su et al. | |
| 7,566,914 B2 | 7/2009 | Salcedo et al. | |
| 7,601,991 B2 | 10/2009 | Salcedo et al. | |
| 7,714,357 B2 | 5/2010 | Hayashi et al. | |
| 7,834,378 B2 | 11/2010 | Ryu et al. | |
| 7,969,006 B2 | 6/2011 | Lin et al. | |
| 8,044,457 B2 | 10/2011 | Salcedo et al. | |
| 8,222,698 B2 | 7/2012 | Salcedo et al. | |
| 8,368,116 B2 | 2/2013 | Salcedo et al. | |
| 8,432,651 B2 | 4/2013 | Salcedo et al. | |
| 2001/0040254 A1 | 11/2001 | Takiguchi | |
| 2002/0021538 A1 | 2/2002 | Chen et al. | |
| 2002/0109190 A1 | 8/2002 | Ker et al. | |
| 2002/0122280 A1 | 9/2002 | Ker et al. | |
| 2002/0187601 A1 | 12/2002 | Lee et al. | |
| 2003/0076636 A1 | 4/2003 | Ker et al. | |
| 2004/0135229 A1 | 7/2004 | Sasahara | |
| 2004/0164354 A1* | 8/2004 | Mergens et al. | 257/355 |
| 2004/0190208 A1 | 9/2004 | Levit | |
| 2004/0207021 A1 | 10/2004 | Russ et al. | |
| 2004/0240128 A1 | 12/2004 | Boselli et al. | |
| 2005/0012155 A1 | 1/2005 | Ker et al. | |
| 2005/0082618 A1 | 4/2005 | Wu et al. | |
| 2005/0087807 A1 | 4/2005 | Righter | |
| 2005/0088794 A1 | 4/2005 | Boerstler et al. | |
| 2005/0093069 A1 | 5/2005 | Logie | |
| 2005/0151160 A1 | 7/2005 | Salcedo et al. | |
| 2006/0033163 A1 | 2/2006 | Chen | |
| 2006/0109595 A1 | 5/2006 | Watanabe et al. | |
| 2006/0145260 A1 | 7/2006 | Kim | |
| 2006/0186467 A1 | 8/2006 | Pendharkar et al. | |
| 2007/0007545 A1 | 1/2007 | Salcedo et al. | |
| 2007/0158748 A1 | 7/2007 | Chu et al. | |
| 2008/0044955 A1 | 2/2008 | Salcedo et al. | |
| 2008/0067601 A1 | 3/2008 | Chen | |
| 2009/0032838 A1 | 2/2009 | Tseng et al. | |
| 2009/0206376 A1* | 8/2009 | Mita et al. | 257/288 |
| 2009/0230426 A1 | 9/2009 | Carpenter et al. | |
| 2009/0309128 A1 | 12/2009 | Salcedo et al. | |
| 2010/0163973 A1* | 7/2010 | Nakamura et al. | 257/328 |
| 2010/0327343 A1 | 12/2010 | Salcedo et al. | |
| 2011/0101444 A1 | 5/2011 | Coyne et al. | |
| 2011/0110004 A1 | 5/2011 | Maier | |
| 2011/0176244 A1 | 7/2011 | Gendron et al. | |
| 2011/0284922 A1 | 11/2011 | Salcedo et al. | |
| 2011/0303947 A1 | 12/2011 | Salcedo et al. | |
| 2011/0304944 A1 | 12/2011 | Salcedo et al. | |
| 2012/0007207 A1 | 1/2012 | Salcedo | |
| 2012/0008242 A1 | 1/2012 | Salcedo | |
| 2012/0199874 A1* | 8/2012 | Salcedo et al. | 257/120 |
| 2012/0205714 A1 | 8/2012 | Salcedo et al. | |
| 2012/0293904 A1 | 11/2012 | Salcedo et al. | |
| 2013/0032882 A1* | 2/2013 | Salcedo et al. | 257/355 |

OTHER PUBLICATIONS

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications*, IEEE Xplore, downloaded Feb. 23, 2010 at 12:53 EST.

Salcedo et al., *Bidirectional Devices for Automotive-Grade Electrostatic Discharge Applications*, IEEE Electron Device Letters, vol. 33, No. 6, Jun. 2012, 3 pages.

Salcedo et al., *On-Chip Protection for Automotive Integrated Circuits Robustness*, IEEE 2012 8th International Caribbean Conference on Devices, Circuits and Systems (ICCDCS), 5 pages (2012).

* cited by examiner

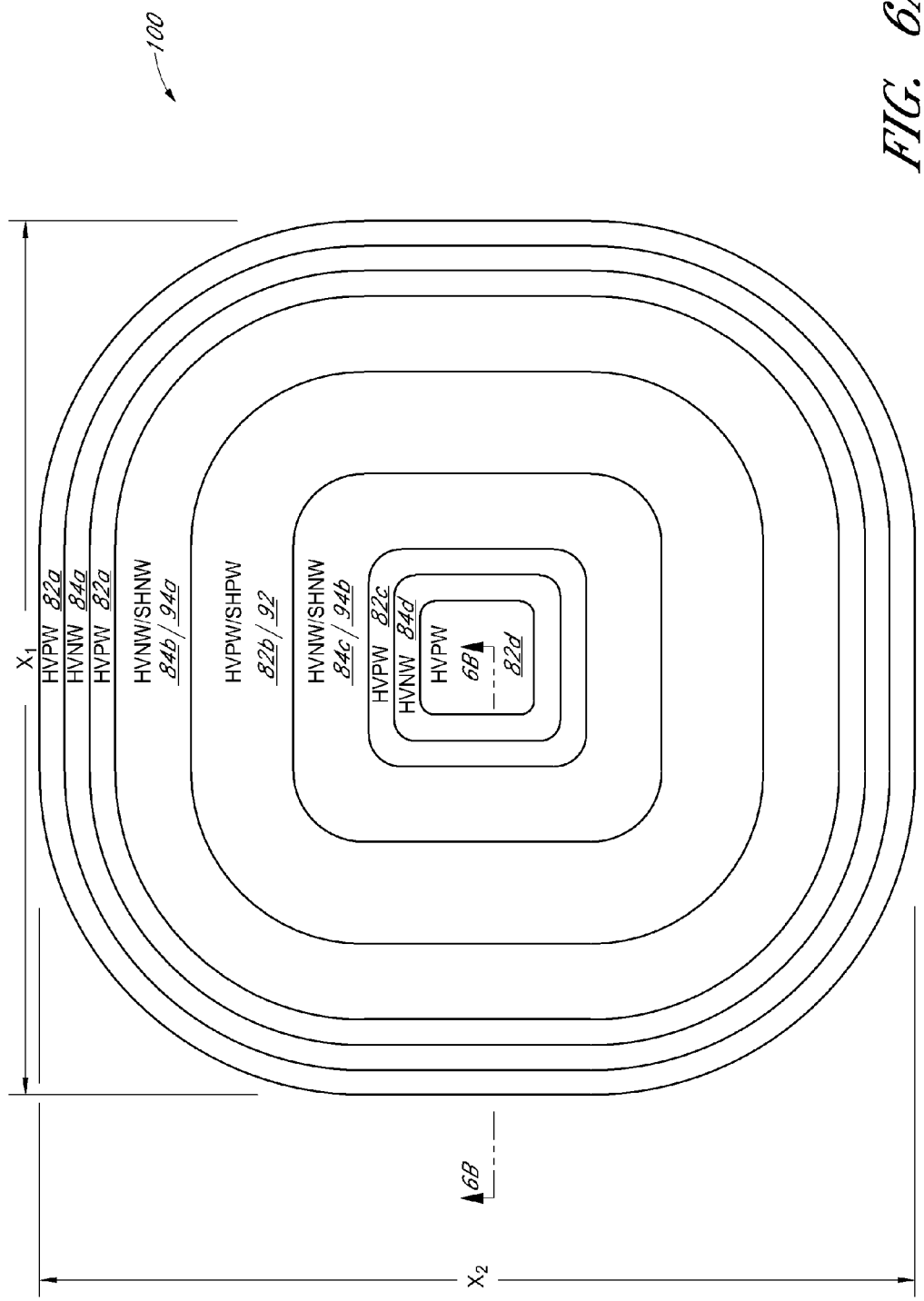

LOW VOLTAGE PROTECTION DEVICES FOR PRECISION TRANSCEIVERS AND METHODS OF FORMING THE SAME

BACKGROUND

1. Field

Embodiments of the invention relate to electronic systems, and more particularly, to dual-tub-isolated bi-directional protection devices for precision transceiver systems.

2. Description of the Related Technology

Certain electronic systems can be exposed to a transient electrical event, or an electrical signal of a relatively short duration having rapidly changing voltage and high power. Transient electrical events can include, for example, electrical overstress/electrostatic discharge (EOS/ESD) events arising from the abrupt release of charge from an object or person to an electronic system.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC.

SUMMARY

In one embodiment, an apparatus for providing protection from transient electrical events is provided. The apparatus includes a first n-type well region, a second n-type well region, a first p-type well region, a p-type tub configured to surround the first p-type well region and the first and second n-type well regions, an n-type tub configured to surround the p-type tub, a first p-type active region disposed in the first n-type well region, and a second p-type active region disposed in the second n-type well region. The first p-type well region is disposed between the first and second n-type well regions, and the first n-type well region, the first p-type well region, and the second n-type well region are configured as an NPN bi-directional bipolar transistor. Additionally, the first p-type active region, the first n-type well region, and the p-type tub are configured as a first PNP bipolar transistor and the second p-type active region, the second n-type well region, and the p-type tub are configured as a second PNP bipolar transistor.

In another embodiment, an apparatus for providing protection from transient electrical events is provided. The apparatus includes a first n-type well region, a second n-type well region, a first p-type well region, a first means for isolating, a second means for isolating, a first p-type active region disposed in the first n-type well region, and a second p-type active region disposed in the second n-type well region. The first p-type well region is disposed between the first and second n-type well regions, and the first n-type well region, the first p-type well region, and the second n-type well region are configured as an NPN bi-directional bipolar transistor. The first isolating means is p-type and surrounds the first p-type well region and the first and second n-type well regions. The second isolating means is n-type and surrounds the first isolating means. Additionally, the first p-type active region, the first n-type well region, and the first isolating means are configured as a first PNP bipolar transistor and the second p-type active region, the second n-type well region, and the first isolating means are configured as a second PNP bipolar transistor.

BRIEF DESCRIPTION OF THE DRAWINGS

FIG. 6A is a schematic top plan layout view of a dual-tub-isolated protection device according to one embodiment.

DETAILED DESCRIPTION OF EMBODIMENTS

Figure 1:
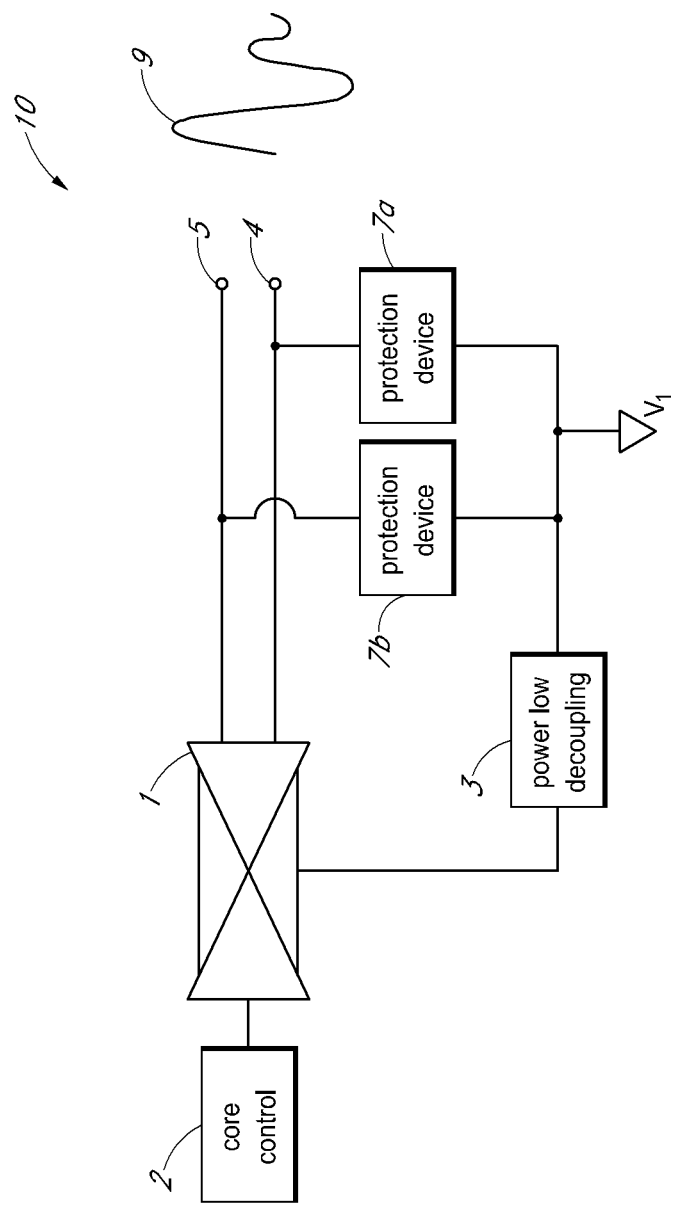
FIG. 1 is a schematic block diagram of one example of a transceiver system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

ESD/EOS stress conditions are more severe in precision communication transceivers operating at variable positive and negative voltage swing and under harsh industrial and automotive environments. For enabling robust precision communication transceivers operating under such environments, limitations are encountered in existing art to discharge high voltage overstress without injecting a large current into the common substrate when the circuit is powered. The high substrate current injection, which can be referred to as majority carrier injection, can be caused by bipolar parasitic transistors formed between terminals of the protection device and a substrate. For instance, a parasitic PNP bipolar transistor can have an emitter formed from a p-type region of the protection device, a base formed from an n-type tub that surrounds the protection device, and a collector formed from a p-type substrate. The bipolar parasitic transistors can inject holes into the substrate, which can lead to unpredictable latch-up conditions in internal circuits formed in a common substrate with the protection device.

The effects of parasitic bipolar current injection may be mitigated by reducing risk of latch-up path triggering by trial-and-error increases in spacing between core circuit blocks and protection devices. However, such an approach can result in unpredictable design iterations, excessive silicon die area increase, extra energy consumption due to leakage injection into the substrate, and/or additional development cost. Thus, there is a need to provide a precision transceiver IC with on-chip protection from such harsh transient electrical environments. Furthermore, there is a need for providing a protection scheme permitting transceiver bi-directional operation voltage swing in the sub ±15 V range that is symmetric or asymmetric relative to a ground or power-low reference. Moreover, there is a need to clamp a transient stress voltage to a safe level within the transient safe operating area of the circuit and to discharge high stress conditions without injecting majority carriers into the substrate during powered stress conditions.

Overview of Examples of Electronic Systems Including Protection Devices

FIG. 1 is a schematic block diagram of one example of a transceiver system 10. The transceiver system 10 includes a transceiver circuit 1, a core control circuit 2, a power low decoupling circuit 3, a first pin 4, a second pin 5, a first protection device 7a, and second protection device 7b.

The first and second pins 4, 5 collectively operate as a differential signaling interface, such as a low voltage differential signaling (LVDS) interface. The transceiver circuit 1 is electrically connected to the first and second pins 4, 5, and can be used to receive and/or transmit signals over the differential signaling interface. The core control circuit 2 is configured to generate control signals for the transceiver circuit 1 so as to control the operation of signaling over the differential signaling interface. For example, the core control circuit 2 can be used to control the transceiver circuit 1 to provide full or half duplex signaling using the first and second pins 4, 5.

The first protection device 7a is electrically connected between the first pin 4 and a first or power low voltage supply $V_1$, and the second protection device 7b is electrically connected between the second pin 5 and the power low voltage supply $V_1$. The power low voltage supply $V_1$ can be, for example, a low impedance power low supply such as ground, and the first and second protection devices 7a, 7b can be used to protect the first and second pins 4, 5, respectively, from a transient electrical event 9. For example, when the transient electrical event 9 is received on the first pin 4, the first protection device 7a can divert or shunt current associated with the transient electrical event 9 to the power low voltage supply $V_1$. Likewise, when the transient electrical event 9 is received on the second pin 5, the second protection device 7b can shunt current to the power low voltage supply $V_1$. In certain implementations, the power low voltage supply $V_1$ is electrically connected to one or more power low pads or pins, such as ground pins.

The transient electrical event 9 can be a rapidly changing high energy signal such as an electrostatic discharge (ESD) event. The transient electrical event 9 can be associated with an overvoltage event caused by user contact. In other implementations, the transient electrical event 9 can be generated by a manufacturer to test the robustness of the transceiver system 10 under a defined stress condition, which can be described by standards set by various organizations, such as the Joint Electronic Device Engineering Council (JEDEC), the International Electrotechnical Commission (IEC), and the Automotive Engineering Council (AEC).

The power low decoupling circuit 3 can be used to isolate a power low voltage supply used by the transceiver circuit 1 from the power low voltage supply $V_1$ used by the first and second protection devices 7a, 7b to divert the current associated with the transient electrical event 9. For example, the power low decoupling circuit 3 can help prevent current from being injected into the transceiver circuit 1 through the power low voltage supply $V_1$ during the transient electrical event 9, thereby helping to prevent overvoltage conditions or latch-up in the transceiver system 10.

The first and second protection devices 7a, 7b can be integrated on-chip with the transceiver circuit 1, the core control circuit 2, and/or the power-low decoupling circuit 3. However, the first and second protection devices 7a, 7b can also be arranged on a separate IC, such as a separately packaged IC or an IC encapsulated in a common package with transceiver circuitry. Thus, the first and second protection devices 7a, 7b can be integrated with a transceiver in a common semiconductor substrate for system-on-a-chip applications, provided as a separate IC in a common package for system-on-a-package applications, or placed in a separately packaged stand-alone IC.

Electronic circuit reliability is enhanced by providing protection devices to the pins or pads of an IC. The protection devices can maintain the voltage level at the pads within a predefined safe range by transitioning from a high-impedance state to a low-impedance state when the voltage of the transient electrical event reaches a trigger voltage. Thereafter, the protection device can shunt at least a portion of the current associated with the transient electrical event before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render protection against positive and negative transient electrical events with fast operational performance and low static power dissipation at normal operating voltage conditions.

Figure 2:
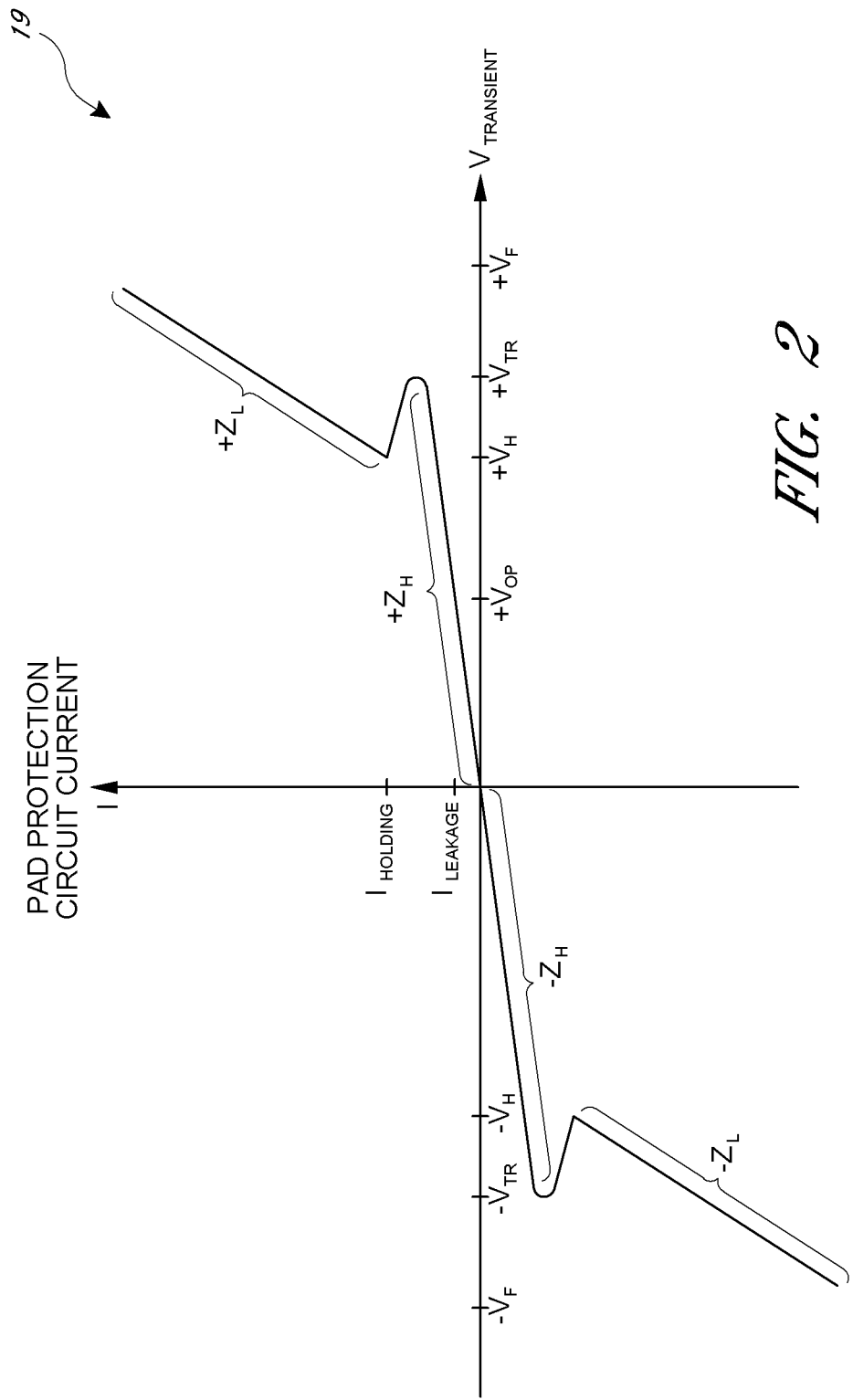
FIG. 2 is a graph showing a relationship between current and voltage of a bi-directional protection device according to one embodiment.

FIG. 2 is a graph 19 showing a relationship between current and voltage of a bi-directional protection device according to one embodiment. As shown in the graph 19, the bi-directional protection device can transition from a high-impedance state $+Z_H$ to a low-impedance state $+Z_L$ when the voltage of the transient signal $V_{TRANSIENT}$ reaches a positive trigger voltage $+V_{TR}$. Thereafter, the bi-directional protection device can shunt a large amount of current and remain in the low-impedance state $+Z_L$ as long as the transient signal voltage level remains above a positive holding voltage $+V_H$. By configuring the protection device to have a trigger voltage $+V_{TR}$ and a holding voltage $+V_H$, the protection device can have improved performance while having enhanced stability against unintended activation.

The bi-directional protection device can also transition from a high-impedance state $-Z_H$ to a low-impedance state $-Z_L$ when the voltage of the transient signal $V_{TRANSIENT}$ reaches a negative trigger voltage $-V_{TR}$. The bi-directional protection device can remain in the low-impedance state $-Z_L$ as long as the voltage magnitude of the negative transient signal is greater than the voltage magnitude of the negative holding voltage $-V_H$. Bi-directional operation of the protection device can permit a reduction in layout area relative to a design that uses separate structures for protection against positive and negative transient electrical events, thereby enabling a more scalable design solution for low voltage operation.

As shown in FIG. 2, the bi-directional protection device can be configured to transition to a low-impedance state before the voltage of the transient signal $V_{TRANSIENT}$ reaches either a positive failure voltage $+V_F$ or a negative failure voltage $-V_F$ that can otherwise cause damage to the IC. When a normal operating voltage $+V_{OP}$ is present across the bi-directional protection device, the bi-directional protection device should conduct a relatively small leakage current $I_{LEAKAGE}$, thereby reducing or minimizing static power dissipation and enhancing the energy efficiency of the IC.

The bi-direction protection device can be configured to be very low leakage at normal operating voltages and to trigger during transient electrical events before internal or core devices reach overvoltage conditions. In certain implementations described herein, protection devices are configured to provide forward and reverse trigger voltages having magnitudes in the range of about 10 V to about 12 V and forward and reverse holding voltages having magnitudes in the rage of about 2.5 to about 5 V so as to limit the magnitude of the voltage across core devices to be less than about 14 V. However, other implementations are possible, including, for example, low noise precision applications in which a single-mode or dual-mode transceiver interface can operate symmetrically in the range of ±3 V, ±5 V, or asymmetrically, for instance in the range of about −1.8 V and 3.3 V. Additionally, the isolated protection device can be co-designed with the core circuit such that the trigger voltage is low enough to protect the transceiver interface, while at the same time the breakdown voltage is high enough to minimize leakage and risk of false triggering, such as at least 3 V to 4 V beyond the operating voltage.

In FIG. 2, voltage is expressed along a horizontal axis, and current is expressed along a vertical axis. In the illustrated embodiment, the protection device has I-V characteristics that are symmetrical. In other implementations, the protection devices described herein can have asymmetrical I-V characteristics. For example, protection devices can have different trigger voltages, holding voltages, and/or failure voltages with different I-V curves in the positive and negative regions of the graph.

Figure 3:
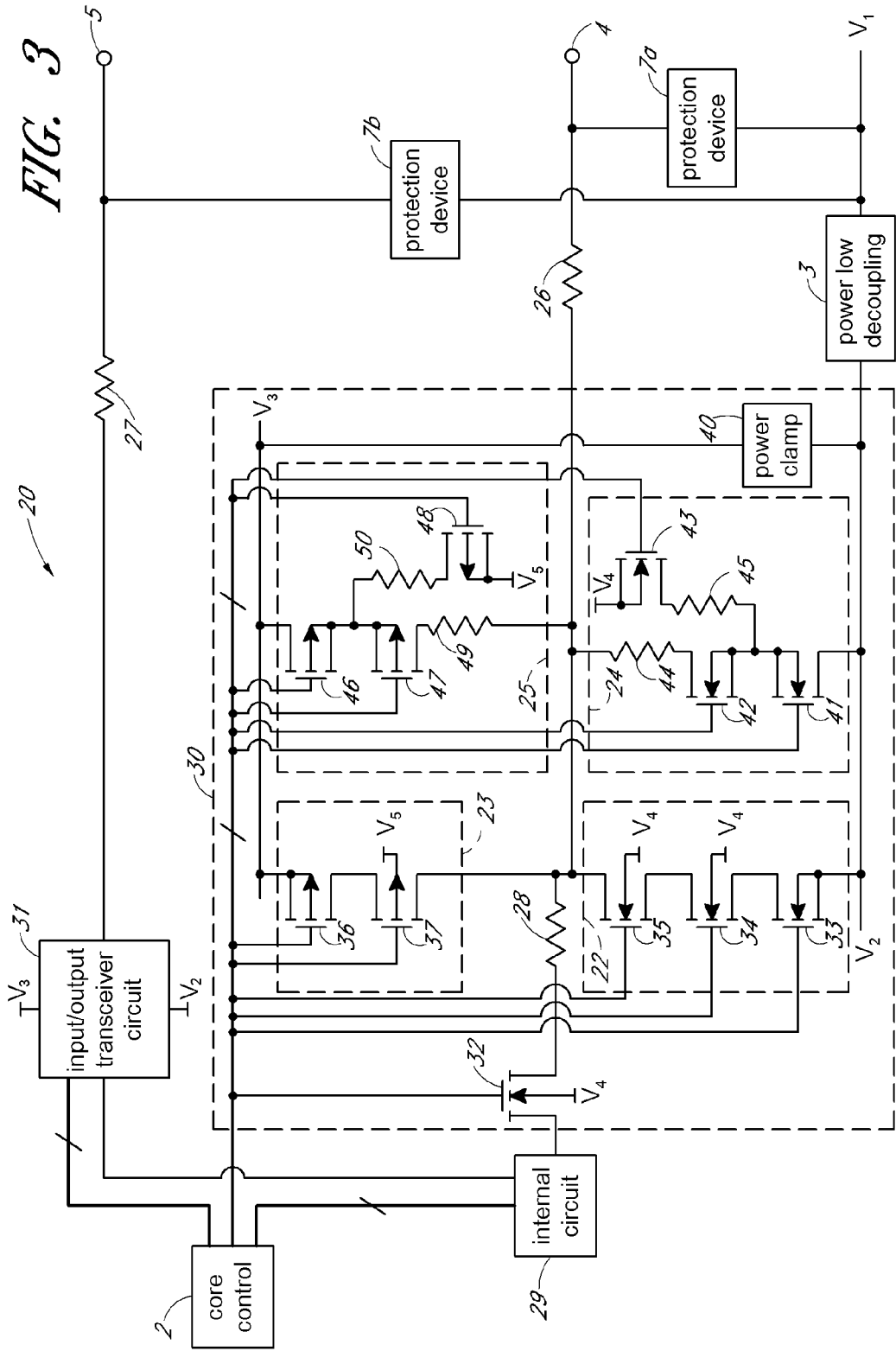
FIG. 3 is a circuit diagram of one example of a transceiver system interface.

FIG. 3 is a circuit diagram of one example of a transceiver system or transceiver system interface 20, which can include one or more protection devices described herein. The transceiver system 20 includes the core control circuit 2, the power low decoupling circuit 3, the first and second pins 4, 5, the first and second protection devices 7a, 7b, first and second resistors 26, 27, an internal circuit 29, and first and second input/output transceiver circuits 30, 31. The transceiver system 20 can be, for example, an interface IC, such as a half or full duplex communication transceiver IC in which the first and second pins 4, 5 are directly exposed to a user, for instance, directly connected to the car cables or an industrial machinery hardness, in a normal operational environment. The transceiver system 20 can be used to communicate data over an interface, such as an interface associated with electrical cables connecting the first and second pins 4, 5 to an engine control unit (ECU) for an automobile or an industrial programmable logic controller (PLC).

The first and second input/output transceiver circuits 30, 31 are electrically connected to the first and second pins 4, 5 through the first and second resistors 26, 27, respectively. Including a resistor in the signal path between an input/output transceiver circuit and a pin can help prevent current associated with a transient electrical event received on the pin from being injected into the input/output transceiver circuit. However, including such a resistor can also impact the integrity of the signals received or transmitted using the input/output transceiver circuit. In certain implementations, the first and second resistor 26, 27 have a resistance selected to be in the range of about 0Ω (omitted) and about 15Ω, for example, about 10Ω. However, persons having ordinary skill in the art will readily ascertain other suitable resistance values, such as resistance values associated with signal processing integrity and/or minimum noise constraints.

The first and second protection devices 7a, 7b have been provided to protect the first and second input/output transceiver circuits 30, 31, the internal circuit 29, and/or the core control circuit 2 from damage due to transient electrical events received on the first and second pins 4, 5. The first protection device 7a is electrically connected between the first pin 4 and the power low voltage supply $V_1$ and the second protection device 7b is electrically connected between the first pin 4 and the power low voltage supply $V_1$. The first protection device 7a can be configured to transition from a high-impedance state to a low-impedance state in response to over or under voltage conditions on the first pin 4, thereby shunting current from the first pin 4 to the power low voltage supply $V_1$. Likewise, the second protection device 7b can be configured to transition from a high-impedance state to a low-impedance state in response to over or under voltage conditions on the second pin 5.

The illustrated power low decoupling circuit 3 has been disposed in an electrical path between the first or power low voltage supply $V_1$ and a second or internal power low voltage supply $V_2$ that is used to electrically power the first and second input/output transceiver circuits 30, 31. Including the power low decoupling circuit 3 can help prevent latch-up of the first and second input/output transceiver circuits 30, 31 when a transient electrical event is received on the first and/or second pins 4, 5 by reducing majority carrier injection into a substrate used to form the input/output transceiver circuits. In certain implementations, the power low decoupling circuit 3 includes a resistor in series with one or more clamping structures, such as anti-parallel diode or junction bipolar transistor structures.

The internal circuit 29 is electrically coupled to the first and second input/output transceiver circuits 30, 31, and can be used to process signals that are received by the first and second input/output transceiver circuits 30, 31. To coordinate receiving and transmitting signals over the first and second pins 4, 5, the core control circuit 2 has been configured to generate control signals for each of the internal circuit 29, the first input/output transceiver circuit 30, and for the second input/output transceiver circuit 31.

The first input/output transceiver circuit 30 has been illustrated to include one example of circuitry suitable for transmitting and receiving signals over the first pin 4. Although not illustrated in FIG. 3 for clarity, the second input/output transceiver circuit 31 can have a similar circuit structure. The illustrated first input/output transceiver circuit 30 includes a first output circuit 22, a second output circuit 23, a first arbitration circuit 24, a second arbitration circuit 25, a third resistor 28, a first n-type metal oxide semiconductor (NMOS) transistor 32, and a power clamp 40. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics used in advanced sub-40-nanometer process technologies.

The first output circuit 22 and the second output circuit 23 can be used for electrically transmitting signals over the first pin 4. For example, the first output circuit 22 is electrically connected between the internal power low voltage supply $V_2$ and the first pin 4, and can be used to decrease the voltage of the first pin 4. Additionally, the second output circuit 23 is electrically connected between a third or power high voltage supply $V_3$ and the first pin 4, and can be used to increase the voltage of the first pin 4.

The first output circuit 22 includes second to fourth NMOS transistors 33-35. The second NMOS transistor 33 includes a source and body electrically connected to the internal power low voltage supply $V_2$ and a drain electrically connected to a source of the third NMOS transistor 34. The fourth NMOS transistor 35 includes a source electrically connected to a drain of the third NMOS transistor 34 and a drain electrically connected to the first pin 4 through the first resistor 26. The third NMOS transistor 34 and the fourth NMOS transistor 35 each further include a body electrically connected to a fourth voltage supply $V_4$. In certain implementations, the fourth voltage supply $V_4$ is selected to be a voltage below the internal power low voltage supply $V_2$ to help achieve target signaling performance. For example, the signaling conditions on the first pin 4 may include positive and negative voltage signaling levels, and the fourth voltage supply $V_4$ can be used to prevent the bodies of the third and fourth NMOS transistor 34, 35 from becoming forward-biased when the first pin 4 has a relatively low voltage level. The second to fourth NMOS transistors 33-35 each further include a gate configured to be controlled using the core control circuit 2. In certain implementations, the voltage level of the gate of the second NMOS transistor 33 is controlled to provide a desired sink current of the first output circuit 22, the voltage level of the gate of the third NMOS transistor 34 is controlled to provide a desired resistance for boosting the output impedance of the first output circuit 22, and the voltage level of the gate of the fourth NMOS transistor 35 is controlled to turn the first output circuit 22 on and off to generate a signal on the first pin 4.

The second output circuit 23 includes first and second p-type metal oxide semiconductor (PMOS) transistors 36, 37. The first PMOS transistor 36 includes a source and a body electrically connected to the power high voltage supply $V_3$ and a drain electrically connected to a source of the second PMOS transistor 37. The second PMOS transistor 37 further includes a drain electrically connected to the first pin 4 through the first resistor 26. The second PMOS transistor 37 further includes a body electrically connected to a fifth voltage supply $V_5$. In certain implementations, the fifth voltage supply $V_5$ is selected to be a voltage above the third voltage supply $V_3$, and can have a magnitude selected to help prevent the body of the second PMOS transistor 37 from becoming forward-biased when the voltage of the first pin 4 increases above the third voltage supply $V_3$. The first and second PMOS transistors 36, 37 each include a gate that can be controlled using the core control circuit 2. In certain implementations, the voltage level of the gate of the first PMOS transistor 36 is controlled to provide a desired source current of the second output circuit 23 and the voltage level of the gate of the second PMOS transistor 37 is controlled to turn the second output circuit 23 on and off to generate a signal on the first pin 4.

The first NMOS transistor 32 can be used to pass signals received on the first pin 4 to the internal circuit 29. The first NMOS transistor 32 includes a drain electrically connected to the internal circuit 29 and a source electrically connected to the first pin 4 through the first and third resistors 26, 28. The core control circuit 2 can control the potential of the gate of the first NMOS transistor 32, thereby controlling the impedance between the internal circuit 29 and the first pin 4 and allowing a voltage level on the first pin 4 to be sensed by the internal circuit 29. As illustrated in FIG. 2, the first NMOS transistor 32 can include a body electrically connected to the fourth potential $V_4$.

In certain implementations, the first and second arbitration circuits 24, 25 can be included to generate the fourth and fifth voltage supplies $V_4$, $V_5$, respectively. The first arbitration circuit 24 can control a voltage level of the fourth voltage supply $V_4$ to be equal to about the lesser of the internal power low voltage supply $V_2$ and the voltage of the first pin 4. Additionally, the second arbitration circuit 25 can control the voltage level of the fifth voltage supply $V_5$ to be equal to about the greater of the power high voltage supply $V_3$ and the voltage of the first pin 4. The first and second arbitration circuits 24, 25 can permit the voltage at the first pin 4 to fall below the internal power low voltage supply $V_2$ and to increase above the power high voltage supply $V_3$ during signaling.

The first arbitration circuit 24 includes a fifth NMOS transistor 41, a sixth NMOS transistor 42, a seventh NMOS transistor 43, a fifth resistor 44, and a sixth resistor 45. The fifth NMOS transistor 41 includes a drain electrically connected to the internal power low voltage supply $V_2$ and a source and body electrically connected to a source and body of the sixth NMOS transistor 42 and to a first end of the sixth resistor 45. The sixth resistor 45 further includes a second end electrically connected to a drain of the seventh NMOS transistor 43. The seventh NMOS transistor 43 further includes a source and a body electrically connected to the fourth voltage supply $V_4$. The fifth resistor 44 includes a first end electrically connected to a drain of the sixth NMOS transistor 42 and a second end electrically connected to the first pin 4 through the first resistor 26. The fifth to seventh NMOS transistors 41-43 each further include a gate controlled using the core control circuit 2. The second arbitration circuit 25 includes a third PMOS transistor 46, a fourth PMOS transistor 47, a fifth PMOS transistor 48, a seventh resistor 49, and an eighth resistor 50. The third PMOS transistor 46 includes a drain electrically connected to the third voltage supply $V_3$ and a source and body electrically connected to a source and body of the fourth PMOS transistor 47 and to a first end of the eighth resistor 50. The eighth resistor 50 further includes a second end electrically connected to a drain of the fifth PMOS transistor 48. The fifth PMOS transistor 48 further includes a source and a body electrically connected to the fifth voltage supply $V_5$. The third to fifth PMOS transistors 46-48 each further include a gate controlled using the core control circuit 2. The seventh resistor 49 includes a first end electrically connected to a drain of the fourth PMOS transistor 47 and a second end electrically connected to the first pin 4 through the first resistor 26.

When a transient electrical event is received on the first pin 4, the voltage of the first pin 4 can increase until a trigger voltage of the first protection device 7a is reached (see FIG. 2). However, in certain implementations, there can be an overshoot of voltage on the first pin 4 before the first protection device 7a activates. In one embodiment, the first and second arbitration circuits 24, 25 and the first and second output circuits 22, 23 are configured to have a trigger voltage greater than an overshoot voltage of the first protection device 7a to aid in preventing the arbitration circuits 24, 25 and/or the output circuits 22, 23 from breaking down before the first protection device 7a activates during a transient electrical event. In one implementation, at least two p-n junctions are disposed in each electrical path between the first pin 4 and the internal power low voltage supply $V_2$ to prevent a parasitic path between the first pin 4 and the internal power low voltage supply $V_2$ from activating before the first protection device 7a turns on during the transient electrical event. As shown in FIG. 2, at least two p-n junctions can be provided in these circuits between the first pin 4 and the internal power low voltage supply $V_2$ by cascading MOS transistor devices. In certain implementations, the power clamp 40 can also be included and configured to have a fewer number of devices in a cascade than the first output circuit 22 so as to help reduce overshoot.

The fifth and seventh resistors 44, 49 can be included in the first and second arbitration circuits 24, 25, respectively, to increase the impedance in parasitic electrical paths between the first pin 4 and the second voltage supply $V_2$ through the first and second arbitration circuits 24, 25. In one implementation, the fifth and seventh resistors 44, 49 each have a resistance selected to be in the range of about 30Ω and about 85Ω, for example, about 72Ω. The sixth and eighth resistors 45, 50 can also aid in increasing the impedance in parasitic paths between the first pin 4 and the internal power low voltage supply $V_2$ through the first and second arbitration circuits 24, 25, as well as to aid the first and second arbitration circuits 24, 25 in generating the fourth and fifth voltage supplies $V_4$, $V_5$, respectively. In certain implementations, the sixth and eighth resistors 45, 50 each have a resistance selected to be in the range of about 30Ω and about 85Ω, for example, about 75Ω. Although various resistor values have been described above, persons having ordinary skill in the art will readily ascertain other suitable resistance values.

The transceiver system 10 of FIG. 1 and the transceiver system 30 of FIG. 3 illustrates two examples of electronic systems suitable for use with the protection devices described herein. However, the transceiver systems can be configured in other ways to meet communication protocol constraints and/or false condition tolerances. Additionally, although the protection devices have been illustrated in the context of transceiver systems, the protection devices described herein can be used in a wide range of ICs and other electronics, including, for example, industrial control systems, interface systems, power management systems, microelectromechanical system (MEMS) sensor systems, automotive systems, wireless infrastructure systems, and/or digital signal processing (DSP) systems. Additionally, although the transceiver systems have been illustrated as including two signal pins and two protection devices, more or fewer protection devices and pins can be included to meet system specifications. Furthermore, the protection devices can be arranged in other ways, such as by electrically connecting each protection device between a pin and a power high pin.

Dual-Tub-Isolated Bi-Directional Protection Devices

Dual-tub-isolated bi-directional protection devices and methods of forming the same are provided herein. In certain implementations, the bi-directional protection device includes a bi-directional NPN bipolar transistor including an emitter/collector formed from a first n-well region, a base formed from a p-well region, and a collector/emitter formed from a second n-well region. P-type active regions are formed in the first and second n-well regions to form a PNPNP structure, which is isolated from the substrate using dual-tub isolation consisting of an n-type isolation region or tub and a p-type isolation region or tub. The dual-tub isolation prevents the wells associated with the PNPNP structure from injecting carriers into the substrate during a transient electrical event and from interacting with external components and circuitry. For example, the dual-tub isolation prevents formation of parasitic bipolar structures that include an emitter formed from a well of the PNPNP structure and a collector formed from the substrate, thereby increasing isolation of the protection device from the substrate and enhancing IC latch-up immunity. Latch-up is often observed in precision transceivers applications when large stress conditions are obtained at the IC pin while the IC is powered. In certain implementations, the size, spacing, and doping concentrations of active regions and wells associated with the PNPNP structure can be selected to provide fine-tuned control of the trigger and holding voltage characteristics to enable the bi-directional protection device to be implemented in applications using low voltage precision interface signaling. The bi-directional protection devices can be used to provide latch-up robustness to a bulk-isolated bipolar CMOS DMOS (BCD) process to a level comparable to a silicon-on-insulator (SOI) process at a substantially lower cost.

Figure 4:
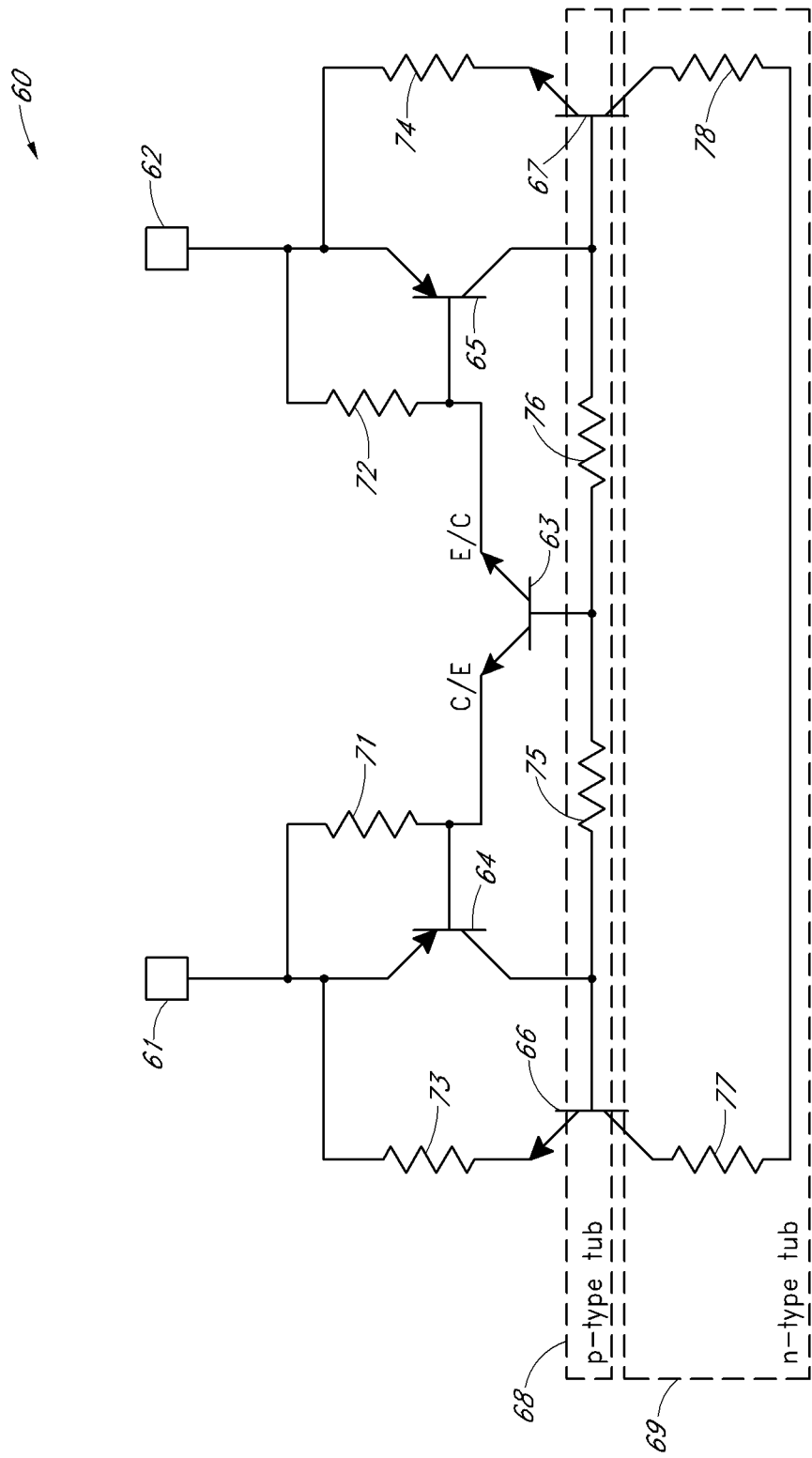
FIG. 4 is a circuit diagram illustrating a bi-directional protection circuit according to one embodiment.

FIG. 4 is a circuit diagram illustrating a bi-directional protection circuit 60 according to one embodiment. The illustrated protection circuit 60 is electrically connected between a first pin or pad 61 and a second pin or pad 62, and can be used to provide low voltage bi-directional blocking voltage protection. The bi-directional protection circuit 60 includes an NPN bi-directional bipolar transistor 63, first and second PNP bipolar transistors 64, 65, first and second NPN bipolar transistors 66, 67, and first to eighth resistors 71-78. The protection circuit 60 can be adapted to serve, for example, any of the protection devices 7a, 7b of FIGS. 1 and 3.

The protection circuit 60 can provide a current shunt path between the first and second pads 61, 62 when there is an overvoltage or undervoltage condition. For example, the first pad 61 can be a signal pin or pad of an IC, such as the first and second signal pins 4, 5 of FIGS. 1 and 3, and the second pad 62 can be a power low pin or pad, such as a pad associated with the power low voltage supply $V_1$ of FIGS. 1 and 3. In certain implementations, the second pad 62 is a ground pad.

The first PNP bipolar transistor 64 includes an emitter electrically connected to the first pad 61, to a first end of the first resistor 71, and to a first end of the third resistor 73. The first PNP bipolar transistor 64 further includes a base electrically connected to a collector/emitter C/E of the NPN bi-directional bipolar transistor 63 and to a second end of the first resistor 71. The first PNP bipolar transistor 64 further includes a collector electrically connected to a first end of the fifth resistor 75 and to a base of the first NPN bipolar transistor 66. The first NPN bipolar transistor 66 further includes an emitter electrically connected to a second end of the third resistor 73 and a collector electrically connected to a first end of the seventh resistor 77. The second PNP bipolar transistor 65 includes an emitter electrically connected to the second pad 62, to a first end of the second resistor 72, and to a first end of the fourth resistor 74. The second PNP bipolar transistor 65 further includes a base electrically connected to an emitter/collector E/C of the NPN bi-directional bipolar transistor 63 and to a second end of the second resistor 72. The second PNP bipolar transistor 65 further includes a collector electrically connected to a first end of the sixth resistor 76 and to a base of the second NPN bipolar transistor 67. The sixth resistor 76 further includes a second end electrically connected to a second end of the fifth resistor 75 and to a base of the NPN bi-directional bipolar transistor 63. The second NPN bipolar transistor 67 further includes an emitter electrically connected to a second end of the fourth resistor 74 and a collector electrically connected to a first end of the eighth resistor 78. The eighth resistor 78 further includes a second end electrically connected to a second end of the seventh resistor 77.

The NPN bi-directional bipolar transistor 63 operates bi-directionally, and the operation of the emitter/collector E/C and the collector/emitter C/E as emitter and collector can depend on the voltage conditions of the first and second pads 61, 62. For example, when a voltage difference between the first pad 61 and the second pad 62 is greater than about a positive trigger voltage $+V_{TR}$ (see FIG. 2) of the protection circuit 60, the emitter/collector E/C of the NPN bi-directional bipolar transistor 63 serves as an emitter and the collector/emitter C/E of the bi-directional bipolar transistor serves as a collector. In contrast, when a voltage difference between the first pad 61 and the second pad 62 is less than about a negative trigger voltage $-V_{TR}$ (see FIG. 2) of the protection circuit 60, the emitter/collector E/C of the NPN bi-directional bipolar transistor 63 serves as a collector and the collector/emitter C/E of the NPN bi-directional bipolar transistor 63 serves as an emitter.

When a transient electrical event increases the voltage of the first pad 61 with respect to the second pad 62 the NPN bi-directional bipolar transistor 63 and the first PNP bipolar transistor 64 operate as a first cross-coupled bipolar PNPN or silicon controlled rectifier (SCR)-like structure. In particular, the NPN bi-directional bipolar transistor 63 and the first PNP bipolar transistor 64 are arranged in feedback such that an increase in the collector current of the first PNP bipolar transistor 64 increases the base current of the NPN bi-directional bipolar transistor 63 and an increase in the collector current of the NPN bi-directional bipolar transistor 63 increases the base current of the first PNP bipolar transistor 64. As the voltage between the first and second pads 61, 62 increases during a positive transient electrical event and reaches a forward trigger voltage of the protection circuit 60, the feedback between the NPN bi-directional bipolar transistor 63 and the first PNP bipolar transistor 64 can be regenerative and cause the protection circuit 60 to enter a low-impedance state. Thereafter, the feedback between the transistors can maintain the protection circuit 60 in the low-impedance state as long as the voltage across the first and second pads 61, 62 exceeds a forward holding voltage of the protection circuit 60. When a transient electrical event decreases the voltage of the first pad 61 with respect to the second pad 62 the NPN bi-directional bipolar transistor 63 and the second PNP bipolar transistor 65 operate as a second cross-coupled bipolar PNPN or SCR-like structure, which can operate in a manner similar to that described above. Since the first and second cross-coupled bipolar PNPN structures each include the NPN bi-directional bipolar transistor 63, the first and second cross-coupled bipolar PNPN structures are referred to herein as collectively operating as a PNPNP structure.

The forward trigger and holding voltages of the protection circuit 60 can be tuned by controlling the gain and conduction strength of the NPN bi-directional bipolar transistor 63 relative to the gain and conduction strength of the first PNP bipolar transistor 64 as well as by selecting the value of the first resistor 71, which is disposed across the base-emitter junction of the first PNP bipolar transistor 64 and can expedite the turn-on of the first PNP bipolar transistor 64 during a transient electrical event. Likewise, the reverse trigger and holding voltages of the protection circuit 60 can be tuned by controlling the gain and conduction strength of the NPN bi-directional bipolar transistor 63 relative to the gain and conduction strength of the second PNP bipolar transistor 65 and by selecting the value of the second resistor 72. The size, spacing, and doping concentrations of active regions and wells associated with the NPN bi-directional bipolar transistor 63 and the first and second PNP bipolar transistors 64, 65 can be selected to provide fine-tuned control of the trigger and holding voltage characteristics to enable the protection circuit 60 to be implemented in applications using low voltage precision interface signaling.

The protection circuit 60 includes dual-tub isolation that prevents the protection circuit 60 from interacting with external components and circuitry formed in a common substrate with the protection circuit 60, thereby providing an IC with superior latch-up immunity. In particular, as shown in FIG. 4, the bases of the first and second NPN bipolar transistors 66, 67 and the fifth and sixth resistors 75, 76 are associated with a p-type isolation region or tub 68, while the collectors of the first and second NPN bipolar transistors 66, 67 and the seventh and eighth resistors 77, 78 are associated with an n-type isolation region or tub 69. The dual-tub isolation prevents the formation of parasitic bipolar structures to the substrate and reduces the amount of charge the protection circuit 60 injects into the substrate during a transient electrical event received between the first and second pads 61, 62.

Figure 5A:
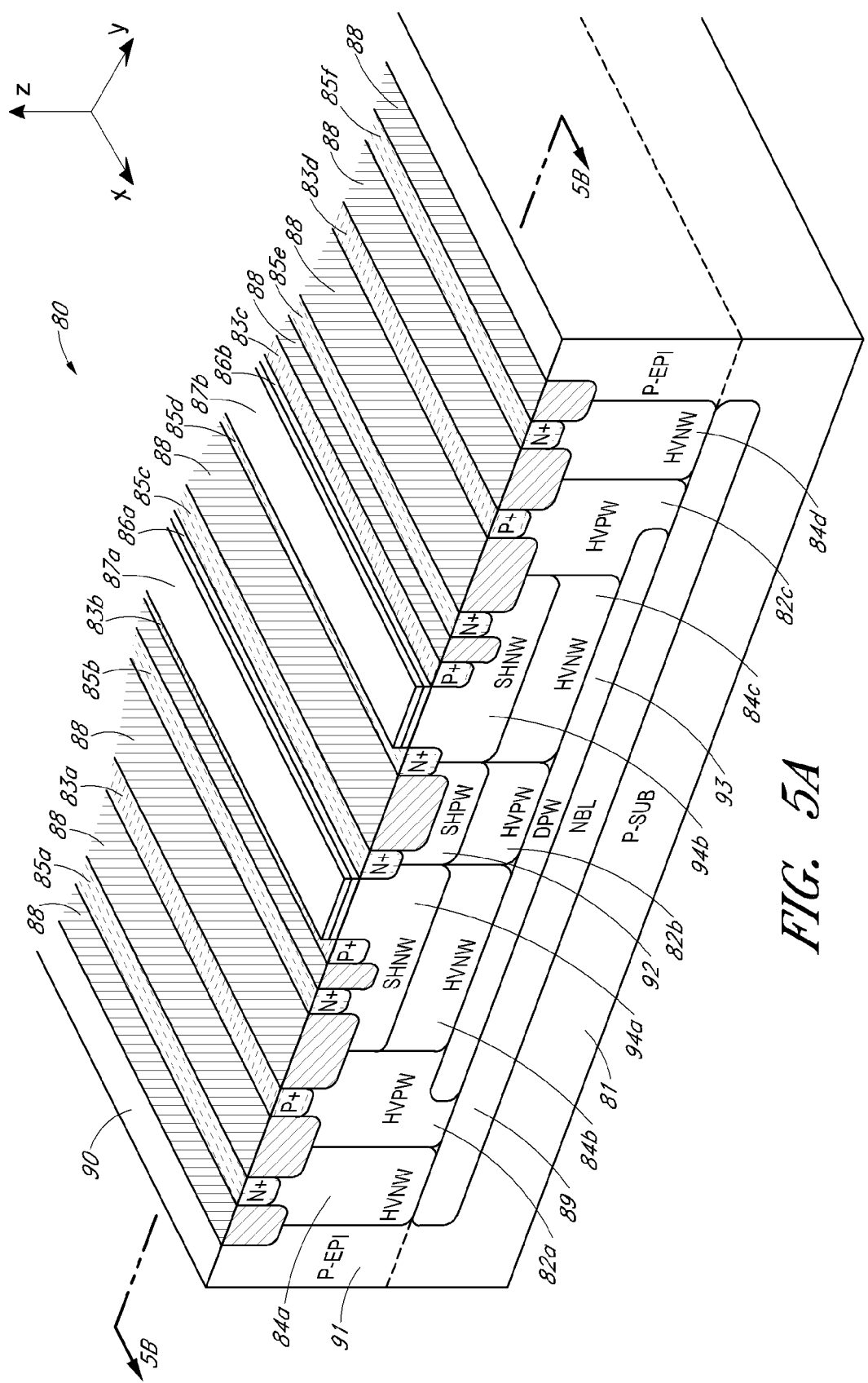
FIG. 5A is a schematic perspective view of a dual-tub-isolated bi-directional protection device implementing the protection circuit of FIG. 4 according to one embodiment.
Figure 5B:
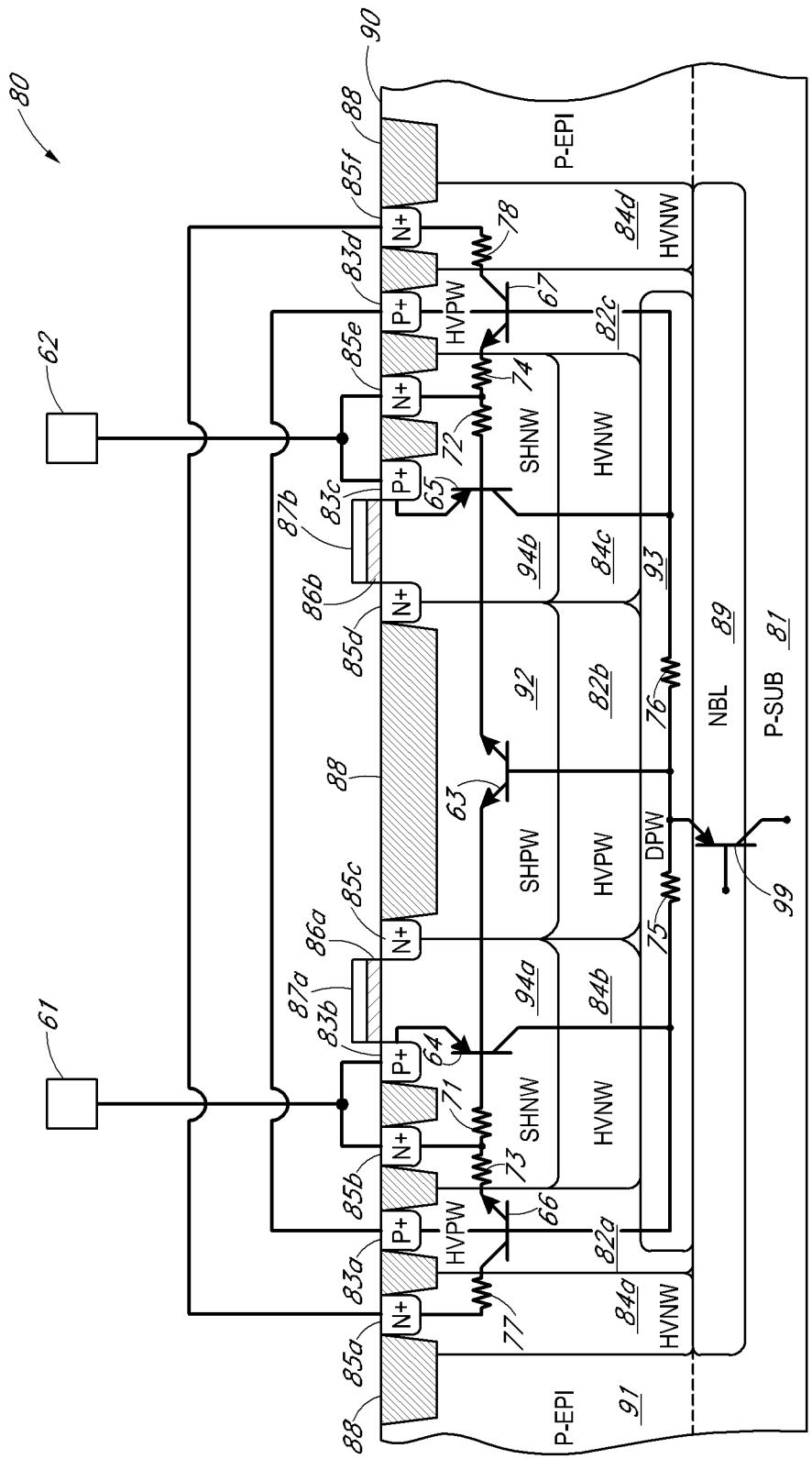
FIG. 5B is an annotated cross section view of the dual-tub-isolated protection device of FIG. 5A taken along the lines 5B-5B.

FIG. 5A is a schematic perspective view of a dual-tub-isolated bi-directional protection device 80 implementing the protection circuit 60 of FIG. 4 according to one embodiment. The protection device 80 includes a p-type substrate (P-SUB) 81, an n-type buried layer (NBL) 89, a p-type epitaxial layer (P-EPI) 91, a deep p-well (DPW) 93, first to fourth high voltage n-wells (HVNWs) 84a-84d, first to third high voltage p-wells (HVPWs) 82a-82c, first and second shallow n-wells (SHNWs) 94a, 94b, shallow p-well (SHPW) 92, first to fourth p-type active (P+) regions 83a-83d, first to sixth n-type active (N+) regions 85a-85f, first and second gate oxide layers 86a, 86b, first and second gate regions 87a, 87b, and oxide regions 88. FIG. 5B is a cross section view of the protection device 80 of FIG. 5A, taken along the lines 5B-5B. The protection device 80 of FIG. 5B has been annotated to show equivalent circuit devices formed from the illustrated structure, such as the NPN bi-directional bipolar transistor 63, the first and second PNP bipolar transistors 64, 65, the first and second NPN bipolar transistors 66, 67, and the first to eighth resistors 71-78 of FIG. 4. Additionally, the cross section has been annotated to show the first and second pads 61, 62 as well as electrical connections within the protection device 80 and to the pads.

The NBL 89 is formed in the P-SUB 81, the P-EPI 91 is formed over the P-SUB 81, and the DPW 93 is formed in the P-EPI 91 over the NBL 89. In certain implementations, the P-EPI 91 is a lightly doped region allowing the operation at relatively high voltage conditions, typically up to 300 V, in mixed-signal high voltage bipolar-CMOS-DMOS (BCD) process technologies for precision transceiver applications. The first to fourth HVNWs 84a-84d and the first to third HVPWs 82a-82c are formed in the P-EPI 91 such that the first HVPW 82a is between the first and second HVNWs 84a, 84b, the second HVPW 82b is between the second and third HVNWs 84b, 84c, and the third HVPW 82c is between the third and fourth HVNWs 84c, 84d. As shown in FIG. 5A, the first and third HVPWs 82a, 82c and the DPW 93 form a p-type isolation region or tub that surrounds the bottom and sides of the second and third HVNW 84b, 84c and the second HVPW 82b and the structures and devices formed therein. In particular, the DPW 93 extends beneath the second and third HVNWs 84b, 84c and the second HVPW 82b, while the first and third HVPWs 82a, 82c contact the DPW 93 and surround the sides of the second and third HVNWs 84b, 84c and the second HVPW 82b. Additionally, the first and fourth HVNWs 84a, 84d and the NBL 89 form an n-type isolation region or tub that surrounds the p-type tub. In particular, the NBL 89 extends beneath the DPW 93 and the first and third HVPWs 82a, 82c, while the first and fourth HVNWs 84a, 84d contact the NBL 89 and surround the sides of the first and third HVPWs 82a, 82c. The dual tub structure formed from the p-type tub and n-type tub can fully isolate the protection device 80 from other devices formed in the P-SUB 81 and/or P-EPI 91.

The first SHNW 94a is formed in the second HVNW 84b, the second SHNW 94b is formed in the third HVNW 84c, and the SHPW 92 is formed in the second HVPW 82b. The first and sixth N+ regions 85a, 85f are formed in the first and fourth HVNWs 84a, 84d, respectively, and the first and fourth P+ regions 83a, 83d are formed in the first and third HVPWs 82a, 82c, respectively. The first and second gate oxide layers 86a, 86b are formed on a surface 90 of the P-EPI 91 over the first and second SHNWs 94a, 94b, respectively. The first and second gate regions 87a, 87b are formed over the first and second gate oxide layers 86a, 86b, respectively, and can be polysilicon layers. At each side of the gate oxide layers 86a, 86b, spacer isolation regions (not shown) can be formed as part of the manufacturing process. The third N+ region 85c is on a first side of the first gate region 87a, and includes a first portion in the SHPW 92 and a second portion in the first SHNW 94a. The second P+ region 83b is in the first SHNW 94a on a second side of the first gate region 87a opposite the first side. The fourth N+ region 85d is on a first side of the second gate region 87b, and includes a first portion in the SHPW 92 and a second portion in the second SHNW 94b. The third P+ region 83c is in the second SHNW 94b on a second side of the second gate region 87b opposite the first side. The second N+ region 85b is in the first SHNW 94a on a side of the second P+ region 83b opposite the first gate region 87a. The fifth N+ region 85e is in the second SHNW 94b on a side of the third P+ region 83c opposite the second gate region 87b.

The illustrated protection device 80 includes the oxide regions 88. Formation of the isolation regions can involve etching trenches in the P-EPI 91, filling the trenches with a dielectric, such as silicon dioxide ($SiO_2$), and removing the excess dielectric using any suitable method, such as chemical-mechanical planarization. In certain implementations, the oxide regions 88 can be shallow trench regions or local oxidation of silicon (LOCOS) regions disposed between active regions.

The protection device 80 can be formed using any suitable manufacturing process. In one embodiment, the P-SUB 81 can be implanted with the NBL 89, and the P-EPI 91 can be grown over the P-SUB 81 and NBL 89 using an epitaxial growth process. Thereafter, the DPW 93 can be implanted in the P-EPI 91, and the HVPWs 82a-82c and HVNWs 84a-84d can be implanted in the P-EPI 91. Next, the SHPW 92 and SHNWs 94a, 94b can be implanted, and the oxide regions 88 can be formed in the P-EPI 91 as previously described above. Thereafter the gate oxide regions 86a, 86b and the gate regions 87a, 87b can be formed over the surface 90 of the P-EPI 91, followed by implantation of the N+ regions 85a-85f and P+ regions 83a-83d. Although one possible manufacturing process of the protection device 80 has been described, variations and other implementations are possible as will be recognized by persons of ordinary skill in the art.

In one embodiment, the P+ regions 83a-83d and the N+ regions 85a-85f have a depth into the surface 90 of the P-EPI 91 in the range of about 0.15 µm and about 0.5 µm, for example, about 0.2 µm, the SHPW 92 and the SHNWs 94a, 94b have a depth into the P-EPI 91 in the range of about 0.5 µm and about 1.5 µm, for example, about 1.0 µm, and the HVPWs 82a-82c and HVNWs 84a-84d have a depth into the P-EPI 91 in the range of about 3.0 µm and about 4.5 µm, for example, about 3.5 µm. Additionally, the P-EPI 91 can have a thickness in the range of about 4 µm and about 6 µm, for example, about 4.5 µm, and the peak doping of the NBL 89 can have a depth into the P-SUB 81 in the range of about 4.0 µm and about 5.5 µm, for example, about 5.0 µm. As shown in FIGS. 5A-5B, the HVPWs 82a-82c can have a depth sufficient to reach the DPW 93, and the HVNWs 84a-84d can have a depth sufficient to reach the NBL 89. The depth of the DPW doping peak can be in the range of 1.5 µm to 3 µm, for example, 2.0 µm. In certain implementations, the oxide regions 88 can be relatively deeper than the P+ regions 83a-83d and the N+ regions 85a-85f. Although various examples of depths have been described above, persons having ordinary skill in the art will readily ascertain other suitable depth values.

In one embodiment, the P-SUB 81 has a peak doping concentration in the range of about $0.5 \times 10^{15}$ atoms/$cm^{-3}$ or $cm^{-3}$ to about $1.5 \times 10^{15}$ $cm^{-3}$, for example, about $1.0 \times 10^{15}$ $cm^{-3}$, the P-EPI 91 has a peak doping concentration in the range of about $1 \times 10^{14}$ $cm^{-3}$ to about $8.0 \times 10^{14}$ $cm^{-3}$, for example, about $2.0 \times 10^{14}$ $cm^{-3}$. Additionally, the DPW 93 has a peak doping concentration in the range of about $8 \times 10^{16}$ $cm^{-3}$ to about $2 \times 10^{17}$ $cm^{-3}$, for example, about $1.0 \times 10^{17}$ $cm^{-3}$, and the NBL 89 has a peak doping concentration in the range of about $0.5 \times 10^{17}$ $cm^{-3}$ to about $4 \times 10^{17}$ $cm^{-3}$, for example, about $2.5 \times 10^{17}$ $cm^3$. Furthermore, the P+ regions 83a-83d and the N+ regions 85a-85f have a peak doping concentration in the range of about $1 \times 10^{20}$ $cm^{-3}$ to about $8 \times 10^{20}$ $cm^{-3}$, for example, about $5 \times 10^{20}$ $cm^{-3}$, the SHPW 92 and the SHNWs 94a, 94b have a peak doping concentration in the range of about $2.5 \times 10^{17}$ $cm^{-3}$ to about $9.5 \times 10^{17}$ $cm^{-3}$, for example, about $7.0 \times 10^{17}$ $cm^{-3}$, and the HVPWs 82a-82c and HVNWs 84a-84d have a peak doping concentration in the range of about $1.5 \times 10^{16}$ $cm^{-3}$ to about $7.5 \times 10^{16}$ $cm^{-3}$, for example, about $3.0 \times 10^{16}$ $cm^{-3}$. Accordingly, the HVPWs 82a-82c can have a peak doping concentration that is less than a peak doping concentration of the SHPW 92, but a depth of the HVPWs 82a-82c can be greater than a depth of the SHPW 92. Similarly, the HVNWs 84a-84d can have a peak doping concentration that is less than a peak doping concentration of the SHNWs 94a, 94b, but a depth of the HVNWs 84a-84d can be greater than a depth of the SHNWs 94a, 94b. Although various ranges of peak doping concentrations and depth have been described above, persons having ordinary skill in the art will readily ascertain other suitable doping concentrations.

The protection device 80 can undergo back end processing to form contacts and metallization. Additionally, although not illustrated in FIGS. 5A-5B, the P-SUB 81 can also include other devices or structures formed therein. Skilled artisans will appreciate that these details have been omitted from this figure for clarity.

With reference now to FIG. 5B, the first pad 61 is electrically connected to the second P+ region 83b and to the second N+ region 85b, and the second pad 62 is electrically connected to the third P+ region 83c and to the fifth N+ region 83e. Additionally, the first N+ region 85a is electrically connected to the sixth N+ region 85f, and the first P+ region 83a is electrically connected to the fourth P+ region 83d. The NPN bi-directional bipolar transistor 63 includes a collector/emitter C/E formed from a first n-well region including the first SHNW 94a and the second HVNW 84b, a base formed from a p-well region including the SHPW 92 and the HVPW 82b, and an emitter/collector E/C formed from a second n-well region including the second SHNW 94b and the third HVNW 84c. The first PNP bipolar transistor 64 includes an emitter formed from the second P+ region 83b, a base formed from the first SHNW 94a and the second HVNW 84b, and a collector formed from the DPW 93. The second PNP bipolar transistor 65 includes an emitter formed from the third P+ region 83c, a base formed from the second SHNW 94b and the third HVNW 84c, and a collector formed from the DPW 93. The first NPN bipolar transistor 66 includes an emitter formed from the first SHNW 94a, a base formed from the first HVPW 82a, and a collector formed from the first HVNW 84a. The second NPN bipolar transistor 67 includes an emitter formed from the second SHNW 94b, a base formed from the third HVPW 82c, and a collector formed from the fourth HVNW 84d. The first and third resistors 71, 73 are formed from the resistance of the first SHNW 94a, and the second and fourth resistors 72, 74 are formed from the resistance of the second SHNW 94b. The fifth and sixth resistors 75, 76 are formed from the resistance of the DPW 93, and the seventh and eighth resistors 77, 78 are formed from the resistances of the first and fourth HVNWs 84a, 84d, respectively.

As shown in FIG. 5B, the n-type tub formed from the NBL 89 and the first and fourth HVNWs 84a, 84d can be electrically floating. Additionally, the p-type tub formed from the DPW 93 and the first and third HVPWs 82a, 82c can be electrically floating. Configuring the p-type tub and the n-type tub in this manner can increase the maximum allowable voltage swing on the first and second pads 61, 62 relative to a configuration in which the p-type tub and/or n-type tub are electrically biased to a fixed potential. However, in some configurations, such as low-leakage implementations, the p-type tub and/or the n-type tub can be electrically connected to a voltage supply. For example, the p-type tub can be electrically connected via a high impedance in the range of 1 M-Ohm to a power low voltage supply equal to or less than a minimum operational voltage of the first and second pads 61, 62 and the n-type tub can be electrically connected to a power high voltage supply equal to or greater than a maximum operational voltage of the first and second pads 61, 62. In one embodiment, the n-type tub is electrically connected to a power high voltage supply equal to or greater than a maximum operational voltage of the first and second pads 61, 62 to provide stronger isolation of the protection device from the substrate, while the p-type tub is configured to be electrically floating to provide maximum bi-directional voltage swing between the first and second pads 61, 62.

In a manner similar to that described earlier, the protection characteristics of the protection device 80 can be tuned by controlling a PNPNP structure associated with the protection device 80. For example, the forward trigger and holding voltages of the protection device 80 can be tuned by controlling the resistances and relative device strengths of a first PNPN structure associated with the NPN bi-directional bipolar transistor 63 and the first PNP bipolar transistor 64, and the reverse trigger and holding voltages of the protection device 80 can be tuned by controlling the resistances and relative device strengths of a second PNPN structure formed from the NPN bi-directional bipolar transistor 63 and the second PNP bipolar transistor 65. The first and second PNPN structures collectively operate as a PNPNP structure. In the illustrated configuration, the SHPW 92 and the first and second SHNWs 94a, 94b have been included in the protection device 80 to control breakdown near the device's surface. To further control the device's protection characteristics, the third and fourth N+ regions 85c, 85d have been included along the boundaries between the SHPW 92 and first and second SHNWs 94a, 94b. The third and fourth N+ regions 85c, 85d have a higher doping concentration than the first and second SHNWs 94a, 94b and thus can be used to control the breakdown voltage of the NPN bi-directional bipolar transistor 63 and enhance feedback within the PNPNP structure during a transient electrical event.

Additionally, the protection device 80 includes the first and second gate regions 87a, 87b, which do not include conventional metal oxide semiconductor (MOS) transistor formation, since active regions of different doping polarities have been implanted on opposing sides of each of the first and second gate regions 87a, 87b. However, during a transient electrical event that increases the voltage of the first pad 61 relative to the voltage of the second pad 62, current can flow with more lateral uniformity from the first pad 61 to the first gate region 87a, thereby providing a conduction path under the first gate region 87a for which carriers can reach the third N+ region 85c and stimulate breakdown. Likewise, during a transient electrical event that increases the voltage of the second pad 62 relative to the voltage of the first pad 61, a current can flow with more lateral uniformity from the second pad 62 to the second gate region 87b, thereby providing a conduction path under the second gate region 87b for which carriers can reach the fourth N+ region 85d. However, during normal operating conditions, even at relatively high quasi-static voltages, the impedance between the first and second pads 61, 62 and the third and fourth N+ active regions 85c, 85d can be relatively high, thereby providing enhanced protection against unintended activation of the protection device 80 and minimizing standing leakage current.

The dual-tub isolation used in the protection device 80 prevents the formation of parasitic bipolar structures to the P-SUB 81, thereby enhancing the isolation of the protection device 80. For example, the protection device 80 has been annotated to show a parasitic PNP bipolar transistor 99 including an emitter formed from the DPW 93, a base formed from the NBL 89 and a collector formed from the P-SUB 81. As shown in FIG. 5B, the parasitic PNP bipolar transistor 99 includes an emitter and base formed from the p-type tub and the n-type tub rather than from the wells used to form the bi-directional bipolar transistor 63, such as the SHNWs 94a, 94b and SHPW 92. The n-type tub base of this parasitic PNP bipolar can be biased at a power-high voltage, further eliminating any current path to substrate without interacting with the bidirectional device functionality during power-up conditions as well as by eliminating any potential latchup path from the protection clamp to other component in the same substrate.

Although the protection device 80 illustrates one implementation of the protection circuit 60 of FIG. 4, the protection circuit 60 can be implemented in other ways. For example, the p-type and n-type tubs used to isolate the protection device from the substrate can be implemented in other ways. As used herein, and as will be understood by one of skill in the art, the term "n-type tub" refers to any suitable n-type tub, including, for example, those used in buried n-layer technologies or in deep n-well technologies. Likewise, the term "p-type tub" refers to any suitable p-type tub.

Figure 6B:
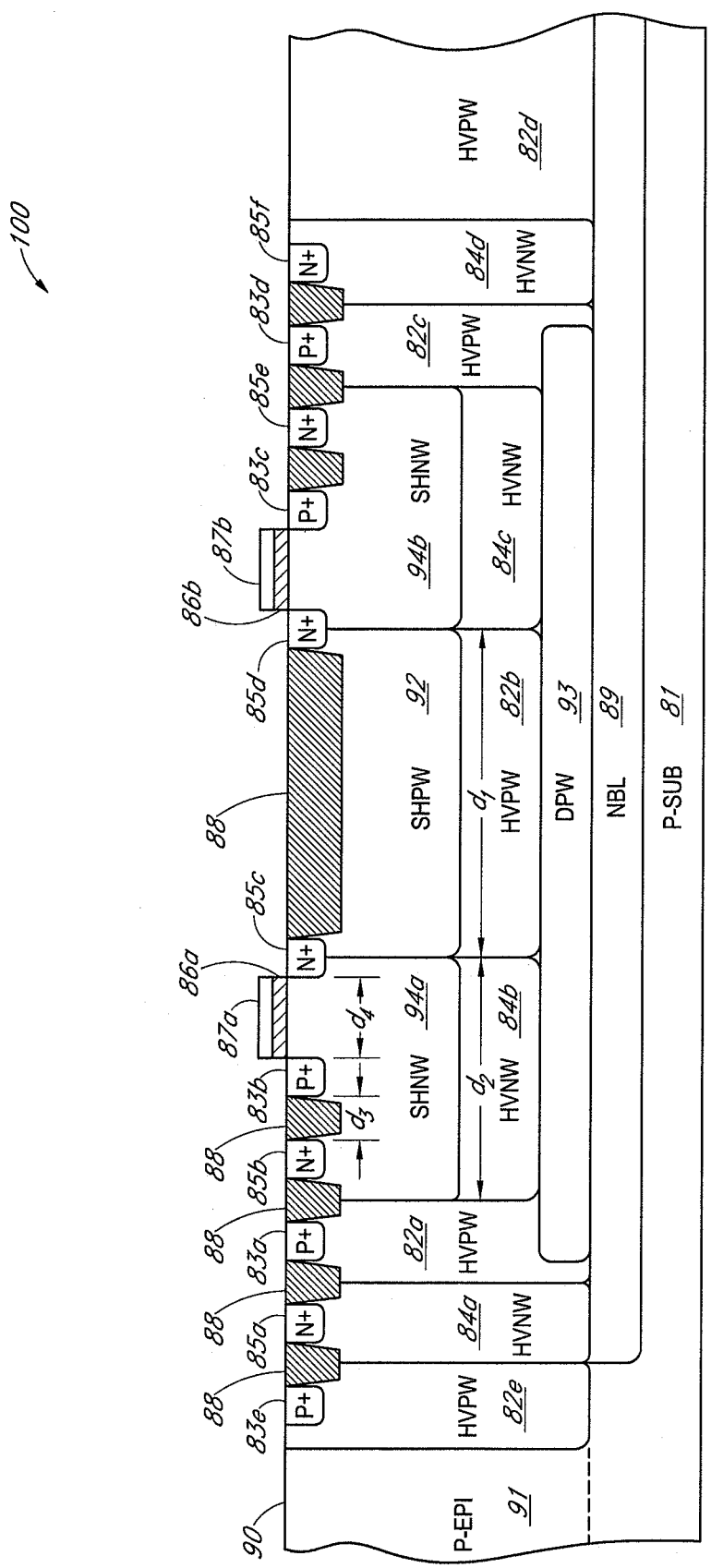
FIG. 6B is an annotated cross section view of the dual-tub-isolated protection device of FIG. 6A taken along the lines 6B-6B.

FIG. 6A is a schematic top plan layout view of a dual-tub-isolated bi-directional protection device 100 according to one embodiment. FIG. 6B is an annotated cross section view of the protection device 100 of FIG. 6A taken along the lines 6B-6B. The protection device 100 includes p-type substrate (P-SUB) 81, n-type buried layer (NBL) 89, p-type epitaxial layer (P-EPI) 91, first to fourth high voltage n-wells (HVNWs) 84a-84d, first to fifth high voltage p-wells (HVPWs) 82a-82e, first and second shallow n-wells (SHNWs) 94a, 94b, shallow p-well (SHPW) 92, first to fifth p-type active (P+) regions 83a-83e, first to sixth n-type active (N+) regions 85a-85f, first and second gate oxide layers 86a, 86b, first and second gate regions 87a, 87b, and oxide regions 88. For purposes of clarity, only the HVNWs and HVPWs have been illustrated in the top plan layout view of FIG. 6A. This layout top-view also can include an embedded bond pad (not shown), which allows the formation of area-efficient protection and facilitates package bonding compatibility at the periphery of the die.

The protection device 100 illustrates one example of an annular implementation of the protection device 80 of FIGS. 5A-5B. The protection device 100 of FIGS. 6A-6B is similar to the protection device 80 of FIGS. 5A-5B, except that the protection device 100 further includes the fourth and fifth HVPWs 82d, 82e and the fifth P+ region 83e. Additionally, the protection device 100 is configured as an annular ring, such that the fourth HVNW 84d is a first ring that surrounds the fourth HVPW 82d, the third HVPW 82c is a second ring that surrounds the fourth HVNW 84d, the third HVNW 84c is a third ring that surrounds the third HVPW 82c, the second HVPW 82b is a fourth ring that surrounds the third HVNW 84c, the second HVNW 84b is a fifth ring that surrounds the second HVPW 82b, the first HVPW 82a is a sixth ring that surrounds the second HVNW 84b, the first HVNW 84a is a seventh ring that surrounds the first HVPW 82a, and the fifth HVPW 82e is an eighth ring that surrounds the first HVNW 84a. Configuring the wells as rings can help improve the current handling capability and/or reduce the footprint of the protection device.

Although FIGS. 6A-6B illustrate a configuration in which the center of the device includes the fourth HVPW 82d, in certain implementations, an n-type well region such as a HVNW can be used in the center of the device rather than a p-type well region. Additionally, in certain configurations, the fourth HVNW 84d and the fourth HVPW 82d can be omitted and the third HVPW 82c can be configured to operate as the center of the protection device.

The fifth HVPW 82e includes the fifth P+ region 83e formed therein, and can be used as a guard ring around the protection device 100. The guard ring can be used to further reduce the amount of charge that is injected into the P-EPI 91 and/or P-SUB 81 during a transient electrical event. In certain implementations, the guard ring can be connected to a power low voltage supply.

In one embodiment, a signal pad is electrically connected to the second P+ region 83b and to the second N+ region 85b and a power low pad is electrically connected to the third P+ region 83c and to the fifth N+ region 85e.

FIG. 6B has been annotated to show various dimensions of the wells, regions, and layers described above for the protection device 100. For example the protection device 100 has been annotated to show a first dimension $d_1$ corresponding to a width of the HVPW 82b, a second dimension $d_2$ corresponding to a width of the HVNW 82a, a third dimension $d_3$ corresponding to a spacing between the second N+ region 85b and the second P+ region 83b, and a fourth dimension $d_4$ corresponding to a spacing between the second P+ region 83b and the third N+ region 85c. Although dimensions are shown with respect to the left half of the device, the right half of the device can be configured to have similar dimensions.

In one embodiment, the first dimension $d_1$ has a size selected to be in the range of about 2.5 µm to about 8 µm, for instance, 4 µm, the second dimension $d_2$ has a size selected to be in the range of about 4 µm to about 8 µm, for instance, 6.5 µm, the third dimension $d_3$ has a size selected to be in the range of about 0 µm (abutting) to about 2 µm, for instance, 0.6 µm, and the fourth dimension $d_4$ has a size selected to be in the range of about 0.25 µm to about 2 µm, for instance, 1 µm. However, other dimensions will be readily determined by one of skill in the art.

In one embodiment, the footprint of the protection device 100 has a width $x_1$ in the range of about 220 µm to about 170 µm, for example, about 200 µm, and the protection device 100 has a height $x_2$ in the range of about 220 µm to about 170 µm, for example, about 200 µm for a 8 kV IEC-61000-4-2 ESD robustness level. However, other dimensions will be readily determined by one of skill in the art.

Figure 7A:
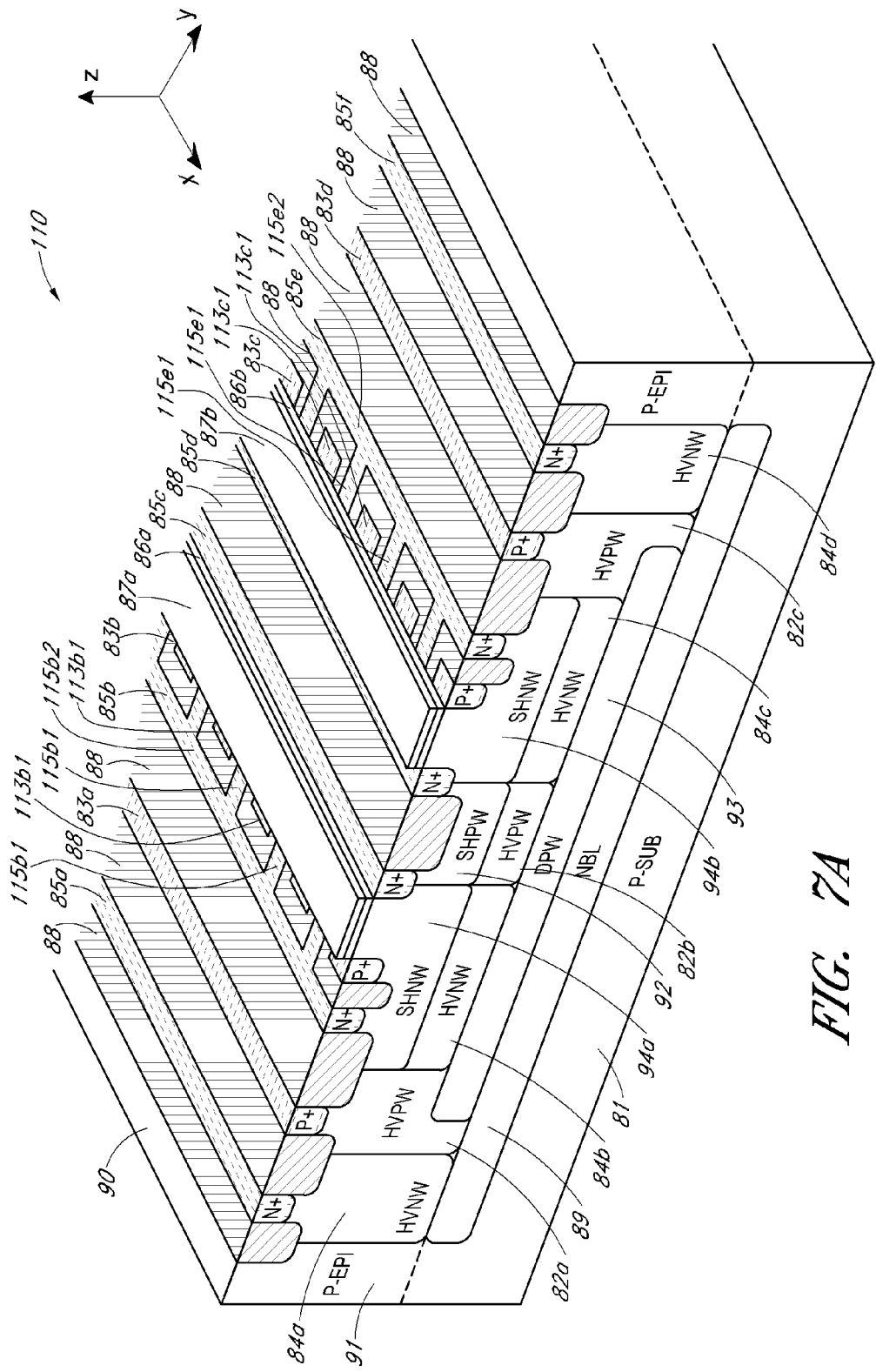
FIG. 7A is a schematic perspective view of a dual-tub-isolated bi-directional protection device according to another embodiment.

FIG. 7A is a schematic perspective view of a dual-tub-isolated bi-directional protection device 110 according to another embodiment. The protection device 110 is similar to the protection device 80 described above with reference to FIGS. 5A-5B, except that the protection device 110 includes a different configuration of the second and third P+ regions 83b, 83c and of the second and fifth N+ regions 85b, 85e. In particular, in the protection device 110 of FIG. 7A, the second P+ region 83b includes a plurality of island regions 113b1 disposed along the x-direction and the second N+ region 85b includes an elongated region 115b2 disposed along the x-direction and protruding regions 115b1 extending in the y-direction such that each of the protruding regions 115b1 extends between two of the island regions 113b1. Similarly, the third P+ region 83c includes a plurality of island regions 113c1 disposed along the x-direction and the fifth N+ region 85e includes an elongated region 115e2 disposed along the x-direction and protruding regions 115e1 extending in the y-direction such that each of the protruding regions 115e1 extends between two of the island regions 113c1.

Configuring the protection device 110 in this manner can be used to increase the holding voltage of the protection device 110 of FIG. 7A relative to the protection device 80 of FIGS. 5A-5B while maintaining a similar breakdown voltage. The increase in holding voltage can be achieved by increasing the size of the N+ regions 85b, 85e relative to the size of the P+ regions 83b, 83c to enhance the gain and conduction strength of the NPN bipolar transistor 63 of FIG. 5B relative to the gain and conduction strength of the PNP bipolar transistors 64, 65 of FIG. 5B.

Figure 7B:
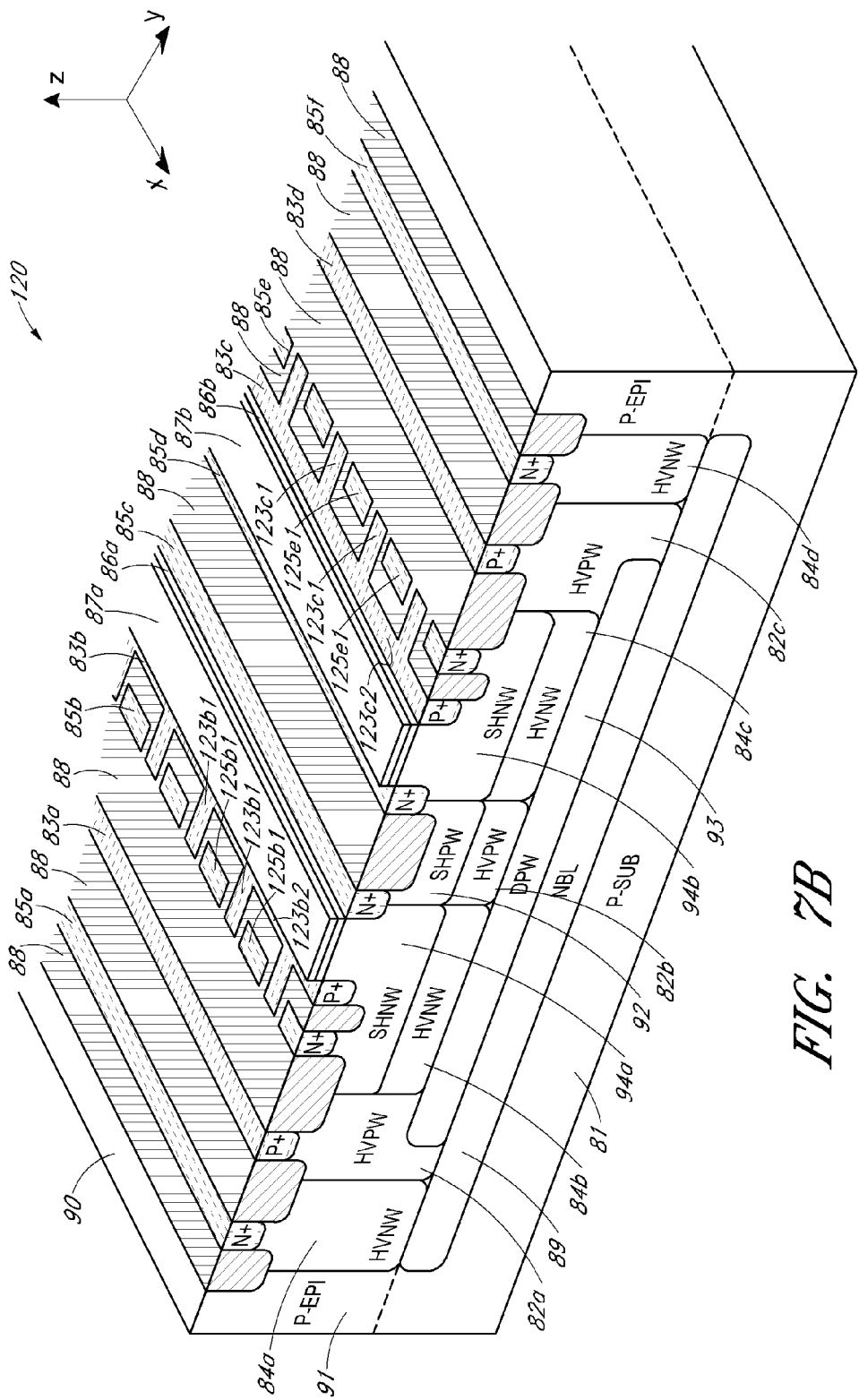
FIG. 7B is a schematic perspective view of a dual-tub-isolated bi-directional protection device according to yet another embodiment.

FIG. 7B is a schematic perspective view of a dual-tub-isolated bi-directional protection device 120 according to yet another embodiment. The protection device 120 is similar to the protection device 80 described above with reference to FIGS. 5A-5B, except that the protection device 120 includes a different configuration of the second and third P+ regions 83b, 83c and of the second and fifth N+ regions 85b, 85e. In particular, in the protection device 120 of FIG. 7B, the second N+ region 85b includes a plurality of island regions 125b1 disposed along the x-direction and the second P+ region 83b includes an elongated region 123b2 disposed along the x-direction and protruding regions 123b1 extending in the y-direction such that each of the protruding regions 123b1 extends between two of the island regions 125b1. Similarly, the fifth N+ region 85e includes a plurality of island regions 125e1 disposed along the x-direction and the third P+ region 83c includes an elongated region 123c2 disposed along the x-direction and protruding regions 123c1 extending in the y-direction such that each of the protruding regions 123c1 extends between two of the island regions 125e1.

Configuring the protection device 120 in this way can increase further the holding voltage of the protection device 120 of FIG. 7B relative to the protection device 80 of FIGS. 5A-5B while maintaining a similar breakdown voltage. The increase in holding voltage can be achieved by increasing the size of the P+ regions 83b, 83c relative to the size of the N+ regions 85b, 85e to enhance the gain and conduction strength of the PNP bipolar transistors 64, 65 of FIG. 5B relative to the gain and conduction strength of the NPN bipolar transistor 63 of FIG. 5B.

Figure 8:
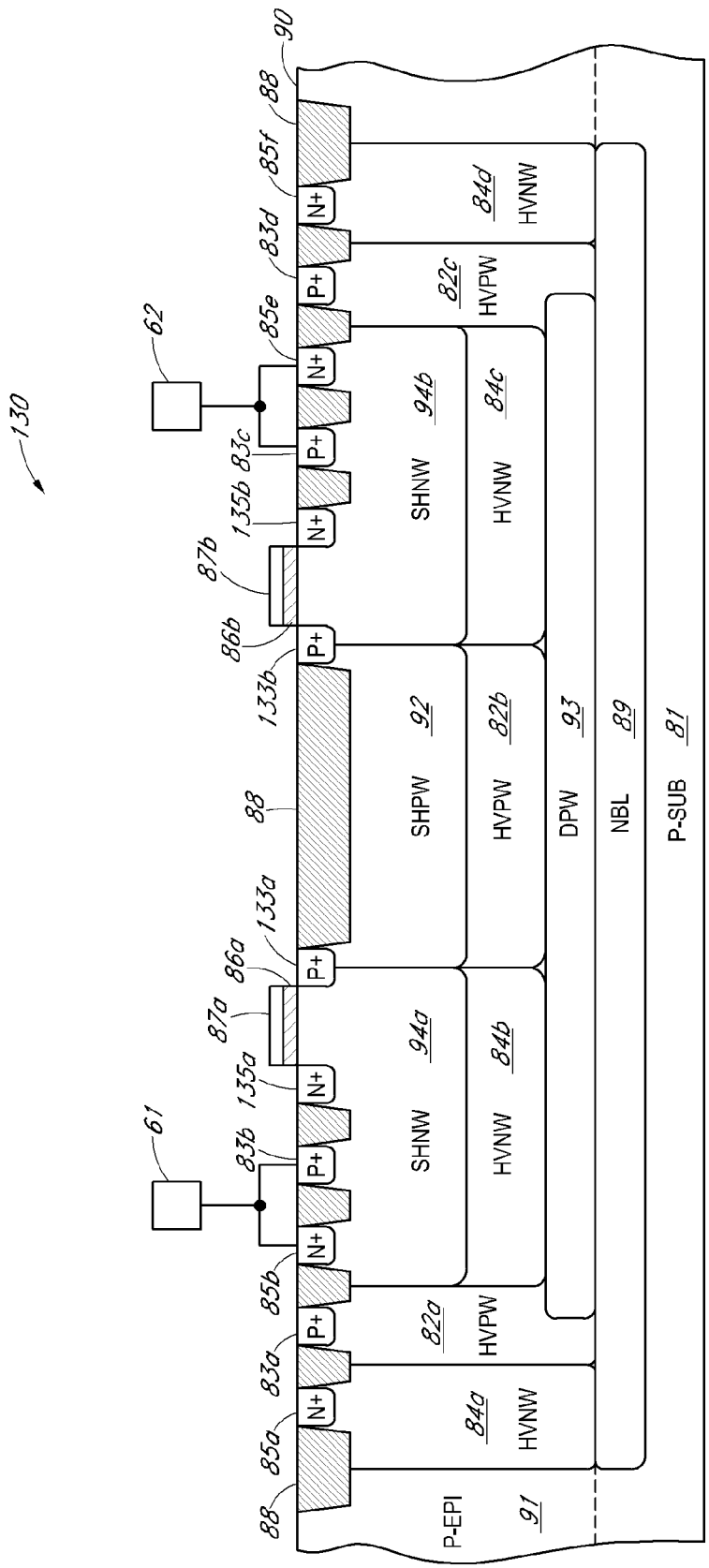
FIG. 8 is a cross section view of a dual-tub-isolated protection device according to another embodiment.

FIG. 8 is a cross section view of a dual-tub-isolated protection device 130 according to another embodiment. The protection device 130 is similar to the protection device 80 described above with reference to FIGS. 5A-5B, except that the protection device 130 illustrates a configuration in which the third and fourth N+ regions 85c, 85d of FIG. 5B have been replaced with first and second P+ regions 133a, 133b, respectively, for customizing the blocking voltage junction at each side of the device. To maintain active areas of opposite doping polarities on each side of the first and second gate layers 87a, 87b and minimize standing leakage current, the protection device 130 further includes a first N+ region 135a disposed in the SHNW 94a and a second N+ region 135b disposed in the SHNW 94b. The P+ regions 133a, 133b have a higher doping concentration than the SHPW 92 and thus can be used to control the breakdown voltage of the NPN bi-directional bipolar transistor 63 of FIG. 5B during a transient electrical event.

FIGS. 9A to 9I illustrate partial cross section views of various embodiments of dual-tub-isolated bi-directional protection devices, which can be used to provide custom bi-directional operation characteristics. FIGS. 9A to 9I show cross-sections of a dual tub isolation structure 140 along with certain structures contained therein, such as the SHPW 92, the SHNWs 94a, 94b, the HVNWs 84a, 84b, and the HVPW 82b. The dual tub isolation structure 140 includes a p-type tub and an n-type tub, which can be as described earlier. Although various wells and active regions are illustrated in the cross-sections of FIGS. 9A-9I, additional structures, such as N+ regions and P+ regions can be formed in the illustrated wells but have been omitted from FIGS. 9A to 9I for clarity. For example, the N+ region 85b and the P+ region 83b of FIGS. 5A-5B can be formed in the SHNW 94a, and the N+ region 85e and the P+ region 83c of FIGS. 5A-5B can be formed in the SHNW 94b.

The illustrated cross-sections show variations of the protection device 80 of FIGS. 5A-5B that can be used to provide fine-tuned control of the protection device's trigger and holding voltage characteristics in both forward and reverse directions. In FIGS. 9A to 9I, the structures are shown to be asymmetrically-formed, in which the left hand side of the protection device is changed relative to the protection device 80 of FIGS. 5A-5B to identify examples of variations used to control the blocking voltage characteristics for the forward operation (left to right positive overvoltage). For example, in one implementation using a 40 to 60 V operation BCD process, the protection devices of FIGS. 9A-9B can provide a forward trigger voltage of less than about 15 V (medium doping level to high doping level breakdown), the protection devices of FIGS. 9C-9D can provide a forward trigger voltage between about 15 V and about 30 V (medium doping level to medium loping level breakdown), the protection devices of FIGS. 9E-9F can provide a forward trigger voltage between about 15 V and about 30 V (high doping level to low doping level breakdown), the protection devices of FIGS. 9G and 9H can provide a forward trigger voltage between about 30 V and about 40 V (medium doping level to low doping level breakdown), and the protection device of FIG. 9I can provide a forward trigger voltage greater than about 40 V (low doping level to low doping level breakdown). Although forward trigger voltage can scale or change with a particular processing technology, the cross-sections of FIGS. 9A to 9I illustrate various configurations of protection devices that can be used to achieve a protection characteristic desired for a particular application.

Figure 9A:
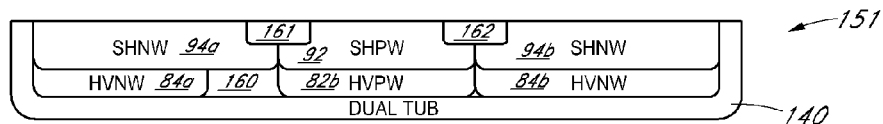
FIGS. 9A to 9I illustrate partial cross section views of various embodiments of dual-tub-isolated bi-direction protection devices with variable geometric features for providing, for example, symmetric and asymmetric operation for precision transceivers.

FIG. 9A illustrates an asymmetric protection device 151 in which the HVNW 84a has a width less than the SHNW 94a such that a lightly-doped p-type region 160 is formed between the HVNW 84a and the HVPW 82b. The p-type region 160 can have a doping concentration similar to that of a background doping concentration, such as a doping concentration of an epitaxial layer in which the p-type region 160 is formed. Including the p-type region 160 can increase the base resistance of the PNP bipolar transistor 64 of FIG. 5B, which can improve the transient response time and decrease the protection device's trigger voltage. The protection device 151 further includes a first active region 161 disposed along a boundary between the SHNW 94a and the SHPW 92 and a second active region 162. The first and second active regions 161, 162 can be either n-type or p-type doping conductivity type.

Figure 9B:
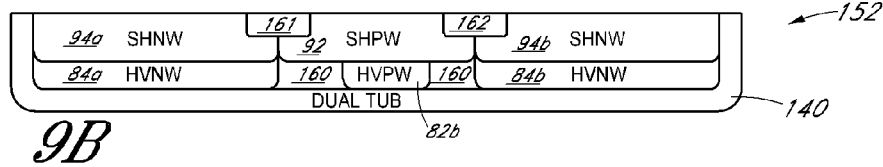
Figure 9C:
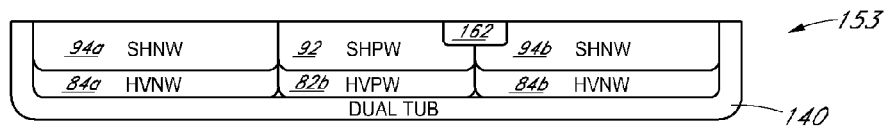
Figure 9D:
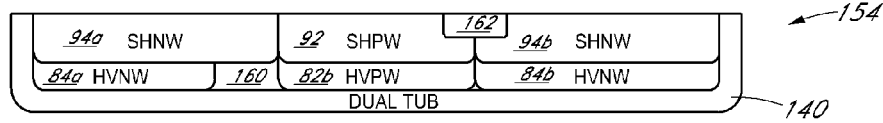

FIG. 9B shows a protection device 152 in which the HVPW 82b is configured to have a width smaller than a width of the SHPW 92 such that p-type regions 160 are formed between the HVPW 82b and each of the HVNWs 84a, 84b. Configuring the protection device 152 in this manner increases instead a base resistance of the NPN bi-directional bipolar transistor 63 of FIG. 5B, which can decrease the protection device's trigger voltage and provide a faster response time. FIG. 9C illustrates a protection device 153 in which the first active region 161 has been omitted, which can increase the protection device's forward trigger voltage. FIG. 9D shows a configuration of a protection device 154 in which the first active region 161 has been omitted and in which the HVNW 84a has a width less than the SHNW 94a such that a p-type region 160 is formed between the HVNW 84a and the HVPW 82b, as was discussed in connection with FIG. 9A.

Figure 9E:
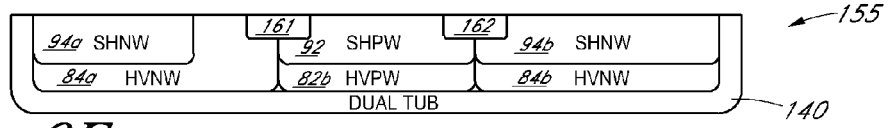
Figure 9F:
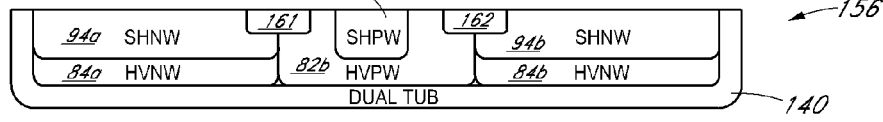
Figure 9G:
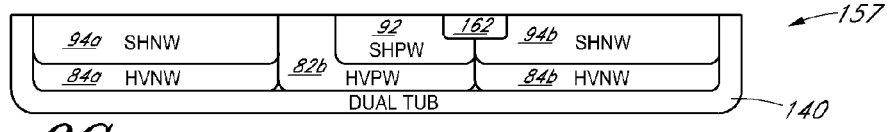
Figure 9H:
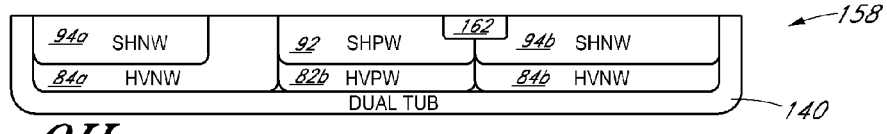
Figure 9I:
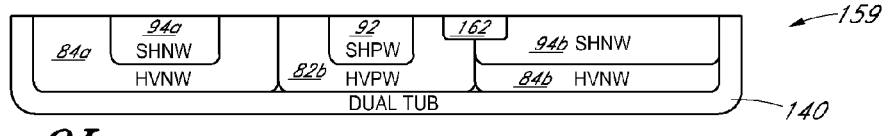

FIG. 9E shows a protection device 155 in which the SHNW 94a has a width less than a width of the HVNW 84a. Configuring the protection device 155 in this manner can increase the protection device's forward trigger voltage by increasing the blocking voltage. Additionally, configuring the device in this manner also increases the PNP base resistance and resistance looking into the collector/emitter of the NPN bi-directional bipolar transistor 63 of FIG. 5B. FIG. 9F illustrates a protection device 156 in which the SHPW 92 has a width less than a width of the HVPW 82b such that the HVPW 82b surrounds the SHPW 92, which can increase the protection device's forward trigger voltage by increasing the blocking voltage from the SHNW 94a/HVNW 84a and active region 161 regions to the HVPW 82b. Additionally, configuring the device in this manner also increases the base resistance of the NPN bi-directional bipolar transistor 63 of FIG. 5B. FIG. 9G shows a protection device 157 in which the SHPW 92 has a width less than a width of the HVPW 82b such that the HVPW 82b surrounds one side of the SHPW 92. Additionally, FIG. 9G shows an implementation in which the first active region 161 has been omitted, thereby further increasing forward trigger voltage relative to the configuration shown in FIG. 9F. The protection device 157 can have a blocking voltage defined by the junction formed by the SHNW 94a and the HVPW 82b, while the spacing from the junction to the SHPW 92 can be adjusted to obtain fine tuning of punch-trough-induced blocking voltages. FIG. 9H shows a configuration of a protection device 158 in which a width of the SHNW 94a is less than a width of the HVNW 84a and in which the first active region 161 has been omitted. FIG. 9I illustrates a protection device 159 in which a width of the SHNW 94a is less than a width of the HVNW 84a such that the HVNW 84a surrounds the SHNW 94a. Additionally, in FIG. 9I the first active region 161 has been omitted and a width of the SHPW 92 is less than a width of the HVPW 82b such that the HVPW 82b surrounds the SHPW 92. The protection device 159 of FIG. 9I can achieve the largest blocking voltage condition for the corresponding process technology by defining the blocking junction formation between two regions with relatively light doping concentration while maintaining the SHPW 92 and SHNWs 94*a*, 94*b* to optimize the blocking voltage and well resistance.

In the embodiments described above, the protections devices can include layers, regions, and/or wells having n-type or p-type dopants. In other embodiments, the doping types of all the layers, regions, and wells of the protection devices can be opposite to those described and shown in the above embodiments, and the same principles and advantages can still apply to the other embodiments. For example, a complementary version of the protection device of FIGS. 5A-5B can be formed using an n-type substrate and n-type epitaxial layer and by reversing the doping polarity of the wells, active regions, and buried layers formed therein. Similarly, complementary versions of the protection devices shown in FIGS. 6A-9I are also possible under the same principle described above.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described above, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described above.

Applications

Devices employing the above described protection schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A protection device for providing protection from transient electrical events, the apparatus comprising:
a first n-type well region;
a second n-type well region;
a first p-type well region disposed between the first and second n-type well regions, wherein the first n-type well region, the first p-type well region, and the second n-type well region are configured as an NPN bi-directional bipolar transistor;
a p-type tub configured to surround the first p-type well region and the first and second n-type well regions, wherein the p-type tub comprises a plurality of sides and a bottom, wherein the bottom extends beneath the first n-type well region, the second n-type well region, and the first p-type well region, and wherein the a bottom of the first-p-type well region is in contact with the p-type tub;
an n-type tub configured to surround the plurality of sides and the bottom of the p-type tub, wherein the bottom comprises an end of the p-type tub opposite a surface of the protection device;
a first p-type active region disposed in the first n-type well region, wherein the first p-type active region, the first n-type well region, and the p-type tub are configured as a first PNP bipolar transistor;
a second p-type active region disposed in the second n-type well region, wherein the second p-type active region, the second n-type well region, and the p-type tub are configured as a second PNP bipolar transistor;
a first pad configured to receive a first voltage;
a second pad separate from the first pad configured to receive a second voltage different from the first voltage;
a first n-type active region disposed in the first n-type well region, wherein the first pad is electrically connected to the first n-type active region; and
a second n-type active region disposed in the second n-type well region, wherein the second pad is electrically connected to the second n-type active region.

2. The protection device of claim 1, further comprising a p-type substrate and a p-type epitaxial layer disposed over the p-type substrate, wherein the first p-type well region and the first and second n-type well regions are disposed in the p-type epitaxial layer.

3. The protection device of claim 2, wherein the n-type tub comprises an n-type buried layer disposed in the p-type substrate, a third n-type well region disposed in the p-type epitaxial layer adjacent a first side of the p-type tub, and a fourth n-type well region disposed in the p-type epitaxial layer adjacent a second side of the p-type tub that is opposite the first side of the p-type tub.

4. The protection device of claim 1, wherein the first pad is electrically connected to the first p-type active region, and wherein the second pad is further electrically connected to the second p-type active region.

5. The protection device of claim 4, wherein the n-type tub and the p-type tub are configured to provide isolation and to minimize the injection of carriers into the p-type substrate when a transient electrical event is received between the first and second pads.

6. The protection device of claim 1, further comprising a third n-type active region and a fourth n-type region, wherein the third n-type active region is disposed along a boundary between the first n-type well region and the first p-type well region, and wherein the fourth n-type active region is disposed along a boundary between the second n-type well region and the first p-type well region.

7. The protection device of claim 6, further comprising a first gate structure disposed over the first n-type well region and a second gate structure disposed over the second n-type well region, wherein the first p-type active region is disposed on a first side of the first gate structure and the third n-type active region is disposed on a second side of the first gate structure, and where the second p-type active region is disposed on a first side of the second gate structure and the fourth n-type active region is disposed on a second side of the second gate structure.

8. The protection device of claim 7, wherein the first p-type active region comprises a first plurality of island regions disposed along a first direction, and wherein the second p-type active region comprises a second plurality of island regions disposed along the first direction.

9. The protection device of claim 8, wherein the first n-type active region comprises a first elongated region disposed along the first direction and a first plurality of protruding regions extending from the first elongated region along a second direction perpendicular to the first direction such that each of the first plurality of protruding regions extends between two of the first plurality of island regions, and wherein the second n-type active region comprises a second elongated region disposed along the first direction and a second plurality of protruding regions extending from the second elongated region along the second direction such that each of the second plurality of protruding regions extends between two of the second plurality of island regions.

10. The protection device of claim 7, wherein the first n-type active region comprises a first plurality of island regions disposed along a first direction, and wherein the second n-type active region comprises a second plurality of island regions disposed along the first direction.

11. The protection device of claim 10, wherein the first p-type active region comprises a first elongated region disposed along the first direction and a first plurality of protruding regions extending from the first elongated region along a second direction perpendicular to the first direction such that each of the first plurality of protruding regions extends between two of the first plurality of island regions, and wherein the second p-type active region comprises a second elongated region disposed along the first direction and a second plurality of protruding regions extending from the second elongated region along the second direction such that each of the second plurality of protruding regions extends between two of the second plurality of island regions.

12. The protection device of claim 1, further comprising a third p-type active region and a fourth p-type region, wherein the third p-type active region is disposed along a boundary between the first n-type well region and the first p-type well region, and wherein the fourth p-type active region is disposed along a boundary between the second n-type well region and the first p-type well region.

13. The protection device of claim 12, further comprising a third n-type active region disposed in the first n-type well region and a fourth n-type active region disposed in the second n-type well region, wherein the third n-type active region is disposed between the first p-type active region and the third p-type active region, and wherein the fourth n-type active region is disposed between the second p-type active region and the fourth p-type active region.

14. The protection device of claim 13, further comprising a first gate structure disposed over the first n-type well region and a second gate structure disposed over the second n-type well region, wherein the third p-type active region is disposed on a first side of the first gate structure and the third n-type active region is disposed on a second side of the first gate structure, and where the fourth p-type active region is disposed on a first side of the second gate structure and the fourth n-type active region is disposed on a second side of the second gate structure.

15. The protection device of claim 1, wherein the first p-type well region comprises a high voltage p-type well and a shallow p-type well disposed in the high voltage p-type well, wherein the high voltage p-type well has a depth greater than a depth of the shallow p-type well, and wherein the high voltage p-type well has a peak doping concentration lower than a peak doping concentration of the shallow p-type well.

16. The protection device of claim 1, wherein the first n-type well region comprises a first high voltage n-type well and a first shallow n-type well disposed in the first high voltage n-type well, and wherein the second n-type well region comprises a second high voltage n-type well and a second shallow n-type well disposed in the second high voltage n-type well, wherein the first and second high voltage n-type wells have a depth greater than a depth of the first and second shallow n-type wells, and wherein the first and second high voltage n-type wells have a peak doping concentration lower than a peak doping concentration of the first and second shallow n-type wells.

17. The protection device of claim 1, wherein the p-type tub comprises a second p-type well region disposed adjacent the first n-type well region, a third p-type well region disposed adjacent the second n-type well region, and a deep p-type well disposed beneath the first p-type well region and the first and second n-type well regions.

18. A protection device for providing protection from transient electrical events, the apparatus comprising:
 a first n-type well region;
 a second n-type well region;
 a first p-type well region disposed between the first and second n-type well regions, wherein the first n-type well region, the first p-type well region, and the second n-type well region are configured as an NPN bi-directional bipolar transistor;
 a first means for isolating, wherein the first isolating means is p-type and surrounds the first p-type well region and the first and second n-type well regions, wherein the p-type tub comprises a plurality of sides and a bottom, wherein the bottom extends beneath the first n-type well region, the second n-type well region, and the first p-type well region, and wherein the a bottom of the first-p-type well region is in contact with the p-type tub;
 a second means for isolating, wherein the second isolating means is n-type and surrounds the plurality of sides and the bottom of the first isolating means, wherein the bottom comprises an end of the p-type tub opposite a surface of the protection device;

a first p-type active region disposed in the first n-type well region, wherein the first p-type active region, the first n-type well region, and the first isolating means are configured as a first PNP bipolar transistor;

a second p-type active region disposed in the second n-type well region, wherein the second p-type active region, the second n-type well region, and the first isolating means are configured as a second PNP bipolar transistor;

a first pad configured to receive a first voltage;

a second pad separate from the first pad configured to receive a second voltage different from the first voltage;

a first n-type active region disposed in the first n-type well region, wherein the first pad is electrically connected to the first n-type active region; and a second n-type active region disposed in the second n-type well region, wherein the second pad is electrically connected to the second n-type active region.

19. The protection device of claim 18, further comprising a p-type substrate and a p-type epitaxial layer disposed over the p-type substrate, wherein the first p-type well region and the first and second n-type well regions are disposed in the p-type epitaxial layer.

20. The protection device of claim 18, wherein the first p-type well region comprises a high voltage p-type well and a shallow p-type well disposed in the high voltage p-type well, wherein the high voltage p-type well has a depth greater than a depth of the shallow p-type well, and wherein the high voltage p-type well has a peak doping concentration lower than a peak doping concentration of the shallow p-type well.

21. The protection device of claim 20, wherein the first n-type well region comprises a first high voltage n-type well and a first shallow n-type well disposed in the first high voltage n-type well, and wherein the second n-type well region comprises a second high voltage n-type well and a second shallow n-type well disposed in the second high voltage n-type well, wherein the first and second high voltage n-type wells have a depth greater than a depth of the first and second shallow n-type wells, and wherein the first and second high voltage n-type wells have a peak doping concentration lower than a peak doping concentration of the first and second shallow n-type wells.

* * * * *

UNITED STATES PATENT AND TRADEMARK OFFICE
CERTIFICATE OF CORRECTION

PATENT NO. : 8,610,251 B1  
APPLICATION NO. : 13/486885  
DATED : December 17, 2013  
INVENTOR(S) : Javier A. Salcedo Page 1 of 1

It is certified that error appears in the above-identified patent and that said Letters Patent is hereby corrected as shown below:

In the Claims:

At Col. 22, line 32 (approx.), Claim 1, please delete "the a" and add --the--.

At Col. 22, line 33 (approx.), Claim 1, please change "first-p-type" to --first p-type--.

At Col. 24, line 61 (approx.), Claim 18, please delete "the a" and add --the--.

At Col. 24, line 61 (approx.), Claim 18, please change "first-p-type" to --first p-type--.

Signed and Sealed this  
Eighth Day of July, 2014

Michelle K. Lee  
*Deputy Director of the United States Patent and Trademark Office*

UNITED STATES PATENT AND TRADEMARK OFFICE
CERTIFICATE OF CORRECTION

Page 1 of 1

PATENT NO.       : 8,610,251 B1
APPLICATION NO.  : 13/486885
DATED            : December 17, 2013
INVENTOR(S)      : Javier A. Salcedo It is certified that error appears in the above-identified patent and that said Letters Patent is hereby corrected as shown below:

In the Claims

At Col. 23, line 11 (approx.), Claim 6, after "a fourth n-type" insert --active--.

At Col. 23, line 64 (approx.), Claim 12, after "a fourth p-type" insert --active--.

Signed and Sealed this
Twenty-fourth Day of May, 2016

Michelle K. Lee
*Director of the United States Patent and Trademark Office*